United States Patent
Onodera

(10) Patent No.: US 8,381,146 B2
(45) Date of Patent: Feb. 19, 2013

(54) COMPUTER PRODUCT, APPARATUS, AND METHOD FOR CORRECTING TIME DELAY VARIATION OF A CIRCUIT DESIGN

(75) Inventor: Mitsuru Onodera, Yokohama (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 13/049,595

(22) Filed: Mar. 16, 2011

(65) Prior Publication Data

US 2011/0314433 A1 Dec. 22, 2011

(30) Foreign Application Priority Data

Jun. 18, 2010 (JP) ................................ 2010-139637

(51) Int. Cl.
*G06F 17/50* (2006.01)

(52) U.S. Cl. ........ 716/106; 716/102; 716/108; 716/111; 716/113; 716/139; 703/13; 703/14; 702/21; 702/22; 702/23; 702/25; 702/31; 702/36; 327/63; 327/65; 327/90; 327/91; 327/105; 327/107; 327/108; 327/111

(58) Field of Classification Search .................. 716/102, 716/106–113, 136, 139; 703/13–14; 326/21–23, 326/25, 31–34; 327/63, 65, 90–91, 105, 327/107, 108–111
See application file for complete search history.

(56) References Cited

U.S. PATENT DOCUMENTS

| | | | | |
|---|---|---|---|---|
| 5,912,569 | A * | 6/1999 | Alleven | 327/108 |
| 6,629,299 | B1 * | 9/2003 | Iwanishi | 716/104 |
| 6,844,755 | B2 * | 1/2005 | Ajit | 326/32 |
| 7,421,379 | B2 * | 9/2008 | Levy | 703/2 |
| 2002/0021135 | A1 | 2/2002 | Li et al. | |
| 2007/0185699 | A1 * | 8/2007 | Suwa et al. | 703/13 |

FOREIGN PATENT DOCUMENTS

| | | |
|---|---|---|
| JP | 10-198720 A | 7/1998 |
| JP | 2004-501438 A | 1/2004 |

* cited by examiner

*Primary Examiner* — Nghia Doan
(74) *Attorney, Agent, or Firm* — Arent Fox LLP

(57) ABSTRACT

A computer-readable, non-transitory medium stores therein a design support program that causes a computer capable of accessing a storage device storing therein for each cell, an output voltage value of the cell, for each elapsed time period from a start of variation of an input voltage applied to the cell, to execute a process. The process includes extracting from the storage device, the output voltage value for each elapsed time period related to an cell under design selected from circuit information of a circuit under design; determining based on a specific voltage value, an extracted elapsed time period to be corrected; adding a time constant of an output from the cell under design to the elapsed time period determined to correction; and outputting the output voltage value for each corrected elapsed time period and the output voltage value for each elapsed time period that is not determined for correction.

5 Claims, 30 Drawing Sheets

FIG.3
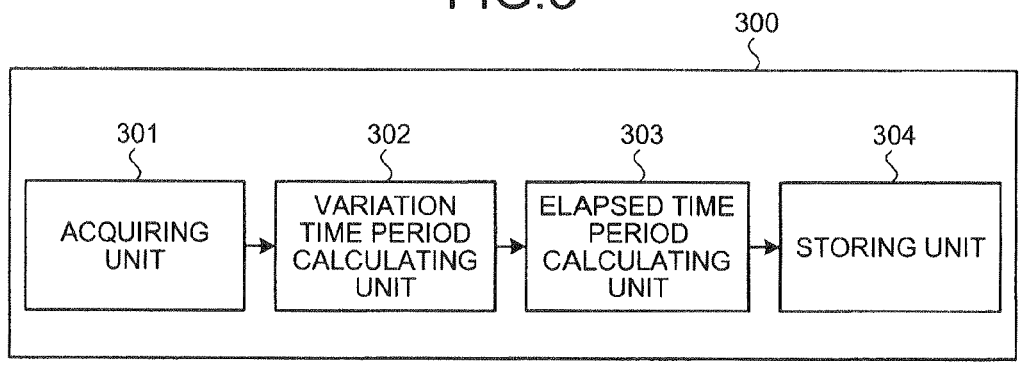
FIG.4
| PTV CONDITION | PROCESS | TEMPERATURE ([°C]) | VOLTAGE ([V]) |
|---|---|---|---|
| TYP CONDITION | TYP | 25 | 1.8 |
| FAST CONDITION | FAST | -40 | 2.0 |
| SLOW CONDITION | SLOW | 120 | 1.1 |
FIG.5
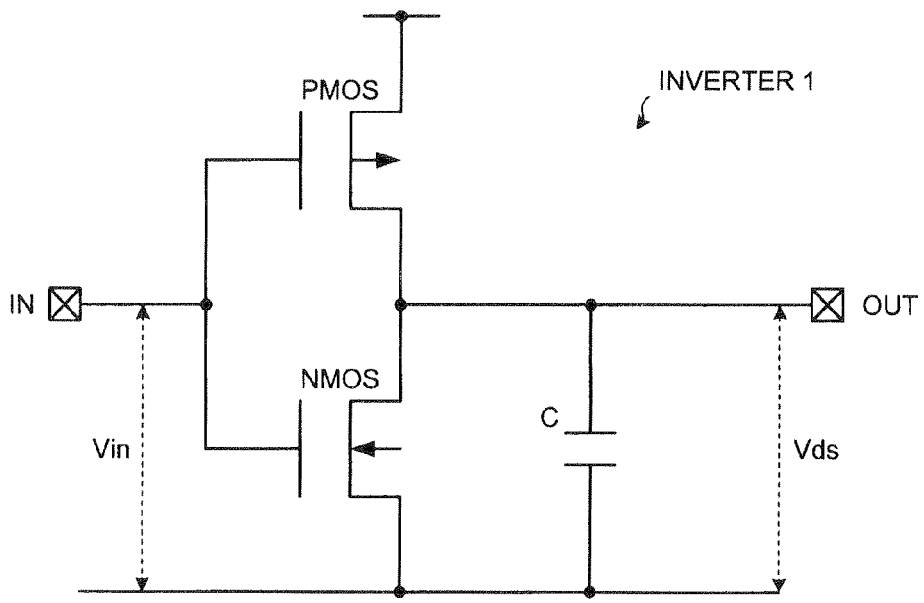

FIG.7

Table 700:

| 702 | 703 | 704 | 705 | 706 | 707 | 708 | 709 | 710 | 711 701 |
|---|---|---|---|---|---|---|---|---|---|
| TRANSISTOR | $\mu$ [cm^2/(V*s)] | Cox (($\epsilon 0 * \epsilon ox)/Tox$) | $\epsilon 0$ [F/cm] | $\epsilon ox$ [F/cm] | Tox [m] | W/L | W [m] | L [m] | C [F] |
| NMOS | 450.00E+00 | 35.42E-06 | 88.54E-15 | 4.00E+00 | 10.00E-09 | 3.33E+00 | 600.00E-09 | 180.00E-09 | 501.76E-15 |
| PMOS | ... | ... | ... | ... | ... | ... | ... | ... | ... |

Table 712:

| 713 | 714 | Vth [V] | |
|---|---|---|---|
| TRANSISTOR | TYPE CONDITION | FAST CONDITION | SLOW CONDITION |
| NMOS | 360.00E-03 | ... | ... |
| PMOS | ... | ... | ... |

FIG.8

| Vds [V] |
|---|
| 1.8 |
| 1.7 |
| 1.6 |
| 1.5 |
| 1.4 |
| 1.3 |
| 1.2 |
| 1.1 |
| 1.0 |
| 0.9 |
| 0.8 |
| 0.7 |
| 0.6 |
| 0.5 |
| 0.4 |
| 0.3 |
| 0.2 |
| 0.1 |
| 0.0 |

FIG.20

| WIRING | WIRING RESISTANCE (UNIT: [Ω]) | WIRING CAPACITANCE (UNIT: [fF]) |
|---|---|---|
| cline 1 | 50 | 5 |
| ⋮ | ⋮ | ⋮ |

FIG.21

| CELL NAME | INPUT CAPACITANCE (UNIT: [fF]) |
|---|---|
| INVERTER 1 | 5 |
| INVERTER 2 | 10 |
| ⋮ | ⋮ |
| BUFFER 1 | 5 |
| BUFFER 2 | 10 |
| ⋮ | ⋮ |

FIG.22

| EXTERNAL INPUT THROUGH | 10.0E-12 |
|---|---|
| EXTERNAL LOAD CAPACITANCE | 10 |
| EXTERNAL LOAD RESISTANCE | 30 |

FIG.23

| CELL NAME | INPUT THRESHOLD (UNIT: [%]) | OUTPUT THRESHOLD (UNIT: [%]) |
|---|---|---|
| DEFAULT | 50 | 50 |
| BUFFER 1 | 40 | 40 |
| BUFFER 2 | 50 | 80 |

| ELAPSED TIME | Ids ([A]) | Vin ([V]) |
|---|---|---|
| 0 | 0.055078963 | 0.0 |
| 1E-12 | 0.055078963 | 0.18 |
| 2E-12 | 0.055078963 | 0.36 |
| 3E-12 | 0.055078963 | 0.54 |
| 4E-12 | 0.055078963 | 0.72 |
| 5E-12 | 0.055036464 | 0.9 |
| 6E-12 | 0.054558348 | 1.08 |
| 7E-12 | 0.053548992 | 1.26 |
| 8E-12 | 0.052008396 | 1.44 |
| 9E-12 | 0.04993656 | 1.62 |
| 10E-12 | 0.047333484 | 1.8 |
| 11E-12 | 0.044199168 | 1.8 |
| 12E-12 | 0.040533612 | 1.8 |
| 13E-12 | 0.036336816 | 1.8 |
| 14E-12 | 0.03160878 | 1.8 |
| 15E-12 | 0.026349504 | 1.8 |
| 16E-12 | 0.020558988 | 1.8 |
| 17E-12 | 0.014237232 | 1.8 |
| 18E-12 | 0.007384236 | 1.8 |
| 19E-12 | 0.0 | 1.8 |

×rDS (32 [Ω])

| ELAPSED TIME | Vds_nonRC ([V]) | Vin ([V]) |
|---|---|---|
| 0 | 1.762526822 | 0.0 |
| 1E-12 | 1.762526822 | 0.18 |
| 2E-12 | 1.762526822 | 0.36 |
| 3E-12 | 1.762526822 | 0.54 |
| 4E-12 | 1.762526822 | 0.72 |
| 5E-12 | 1.761166848 | 0.9 |
| 6E-12 | 1.745867136 | 1.08 |
| 7E-12 | 1.713567744 | 1.26 |
| 8E-12 | 1.664268672 | 1.44 |
| 9E-12 | 1.59796992 | 1.62 |
| 10E-12 | 1.514671488 | 1.8 |
| 11E-12 | 1.414373376 | 1.8 |
| 12E-12 | 1.297075584 | 1.8 |
| 13E-12 | 1.162778112 | 1.8 |
| 14E-12 | 1.01148096 | 1.8 |
| 15E-12 | 0.843184128 | 1.8 |
| 16E-12 | 0.657887616 | 1.8 |
| 17E-12 | 0.455591424 | 1.8 |
| 18E-12 | 0.236295552 | 1.8 |
| 19E-12 | 0.0 | 1.8 |

FIG.25

| ELAPSED TIME | Vds_nonRC ([V]) | Vin ([V]) | Vgs-Vth ([V]) |
|---|---|---|---|
| 000E+00 | 1.762526822 | 0.0 | -0.36 |
| 1E-12 | 1.762526822 | 0.18 | -0.18 |
| 2E-12 | 1.762526822 | 0.36 | 0 |
| 3E-12 | 1.762526822 | 0.54 | 0.18 |
| 4E-12 | 1.762526822 | 0.72 | 0.36 |
| 5E-12 | 1.761166848 | 0.9 | 0.54 |
| 6E-12 | 1.745867136 | 1.08 | 0.72 |
| 7E-12 | 1.713567744 | 1.26 | 0.9 |
| 8E-12 | 1.664268672 | 1.44 | 1.08 |
| 9E-12 | 1.59796992 | 1.62 | 1.26 |
| 10E-12 | 1.514671488 | 1.8 | 1.44 |
| 11E-12 | 1.414373376 | 1.8 | 1.44 |
| 12E-12 | 1.297075584 | 1.8 | 1.44 |
| 13E-12 | 1.162778112 | 1.8 | 1.44 |
| 14E-12 | 1.01148096 | 1.8 | 1.44 |
| 15E-12 | 0.843184128 | 1.8 | 1.44 |
| 16E-12 | 0.657887616 | 1.8 | 1.44 |
| 17E-12 | 0.455591424 | 1.8 | 1.44 |
| 18E-12 | 0.236295552 | 1.8 | 1.44 |
| 19E-12 | 0.0 | 1.8 | 1.44 |

SATURATION REGION Vds ≥ Vgs-Vth

NON-SATURATION REGION Vds < Vgs-Vth

TO BE CORRECTED

FIG.27

| ELAPSED TIME | Vds_RC ([V]) |
|---|---|
| 0 | 1.762526822 |
| 1E-12 | 1.762526822 |
| 2E-12 | 1.762526822 |
| 3E-12 | 1.762526822 |
| 4E-12 | 1.762526822 |
| 5E-12 | 1.761166848 |
| 6E-12 | 1.745867136 |
| 7E-12 | 1.713567744 |
| 8E-12 | 1.664268672 |
| 9E-12 | 1.59796992 |
| 10E-12 | 1.514671488 |
| 11.5E-12 | 1.414373376 |
| 12.5E-12 | 1.297075584 |
| 13.0E-12 | 1.229926848 |
| 13.5E-12 | 1.162778112 |
| 14.0E-12 | 1.087129536 |
| 14.5E-12 | 1.01148096 |
| 15.0E-12 | 0.927332544 |
| 15.5E-12 | 0.843184128 |
| 16.0E-12 | 0.750535872 |
| 16.5E-12 | 0.657887616 |
| 17.0E-12 | 0.55673952 |
| 17.5E-12 | 0.455591424 |
| 18.0E-12 | 0.345943488 |
| 18.5E-12 | 0.236295552 |
| 19.0E-12 | 0.118147776 |
| 19.5E-12 | 0.0 |

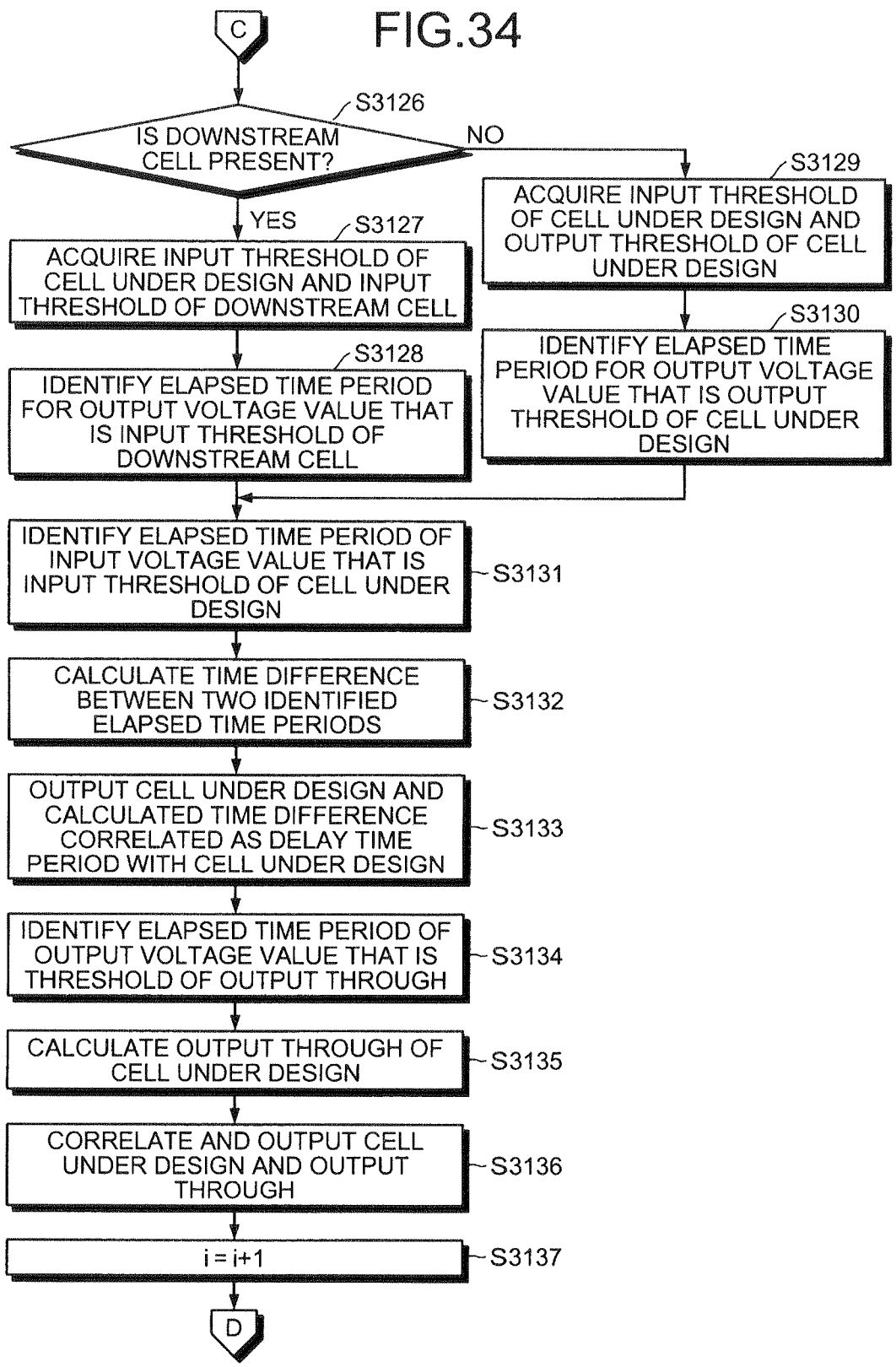

COMPUTER PRODUCT, APPARATUS, AND METHOD FOR CORRECTING TIME DELAY VARIATION OF A CIRCUIT DESIGN

CROSS REFERENCE TO RELATED APPLICATIONS

This application is based upon and claims the benefit of priority of the prior Japanese Patent Application No. 2010-139637, filed on Jun. 18, 2010, the entire contents of which are incorporated herein by reference.

FIELD

The embodiments discussed herein are related to supporting design of a semiconductor integrated circuit.

BACKGROUND

In the design of an analog circuit, techniques of simulating an analog property using a simulator such as SPICE are conventionally known.

Meanwhile, in the design of a digital circuit, an accurate delay time period can also be acquired by executing a simulation using a simulator such as SPICE (see, e.g., International Patent Publication No. 2004-501438) (hereinafter, "first conventional technique"). However, with techniques such as the first conventional technique, a problem arises in that a tremendous amount of time is necessary to execute a simulation for each cell in a circuit under design.

A technique is known of identifying a delay time period and an output-through (a time period necessary for an output voltage output by a cell to rise (or fall)), for each cell used in design employing a simulator such as SPICE, and storing the delay time period and the output-through as a library. The delay time period of each cell in the circuit under design is calculated by referring to the library (see, e.g., Japanese Laid-Open Patent Publication No. H10-198720) (hereinafter, "second conventional technique").

It is known that the delay time period of a path in a circuit under design is calculated by totaling delay time periods of cells that constitute the path.

However, with the second conventional technique, load resistance (such as, for example, wiring resistance) and load capacitance (such as wiring capacitance, and an input capacitance for a downstream cell) of the output of each cell are substituted by lumped constant capacitance, and temporal variation of an output voltage is calculated using SPICE by supplying temporal variation of an input voltage to a circuit model.

The values of the load resistance and the load capacitance differ among cells depending on the layout of the circuit under design and therefore, a problem arises in that an error occurs for the delay time period compared to the case where the first conventional technique is used. In addition, the output voltage value is calculated using only the value of the lumped constant capacitance and therefore, the transient response by R (load resistance) and C (load capacitance) is approximated to a straight line. Therefore, another problem arises in that another error is generated for the delay time period compared to the case where the first conventional technique is used. In addition, when the first conventional technique is used, the above problem of a tremendous amount of time being consumed arises.

When the second conventional technique is used especially in recent processing enabling smaller dimensions, error between the delay time periods acquired by the first and the second conventional techniques becomes conspicuous with the lower voltage, the higher integration, and the higher speed. Therefore, another problem arises in that the effects of error in the delay time period can no longer be disregarded.

SUMMARY

According to an aspect of an embodiment, a computer-readable, non-transitory medium stores therein a design support program that causes a computer capable of accessing a storage device storing therein for each cell, an output voltage value of the cell, for each elapsed time period from a start of variation of an input voltage applied to the cell, to execute a process. The process includes extracting from the storage device, the output voltage value for each elapsed time period related to an cell under design selected from circuit information of a circuit under design; determining, from among the extracted elapsed time periods and based on a specific voltage value, an elapsed time period to be corrected; correcting by adding a time constant of an output from the cell under design to the elapsed time period determined at the determining; and outputting the output voltage value for each elapsed time period corrected at the correcting and the output voltage value for each elapsed time period that is not determined at the determining.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is a functional block diagram of the design support apparatus according to a first embodiment.

FIG. 4 is an explanatory diagram of an example of "process, temperature, and voltage" (PTV) conditions.

FIG. 5 is an explanatory diagram of an example of a cell.

FIG. 7 is an explanatory diagram of a transistor property table.

FIG. 8 is an explanatory diagram of an example of Vds.

FIG. 13 is an explanatory diagram of an exemplary reflection of an input through.

FIG. 20 is an explanatory diagram of an example of a wiring table.

FIG. 21 is an explanatory diagram of an example of input capacitance of a cell.

FIG. 22 is an explanatory diagram of an example of a constraint table.

FIG. 23 is an explanatory diagram of an example of a threshold table.

FIG. 25 is an explanatory diagram of exemplary determination of an elapsed time period to be corrected.

FIG. 27 is an explanatory diagram of a correction result.

FIG. 29 is an explanatory diagram of exemplary calculation of output-through.

FIGS. 31 to 34 are flowcharts of an example of a process procedure for a design support process by the design support apparatus according to the second embodiment.

DESCRIPTION OF EMBODIMENTS

Preferred embodiments of the present invention will be explained with reference to the accompanying drawings.

Figure 1:
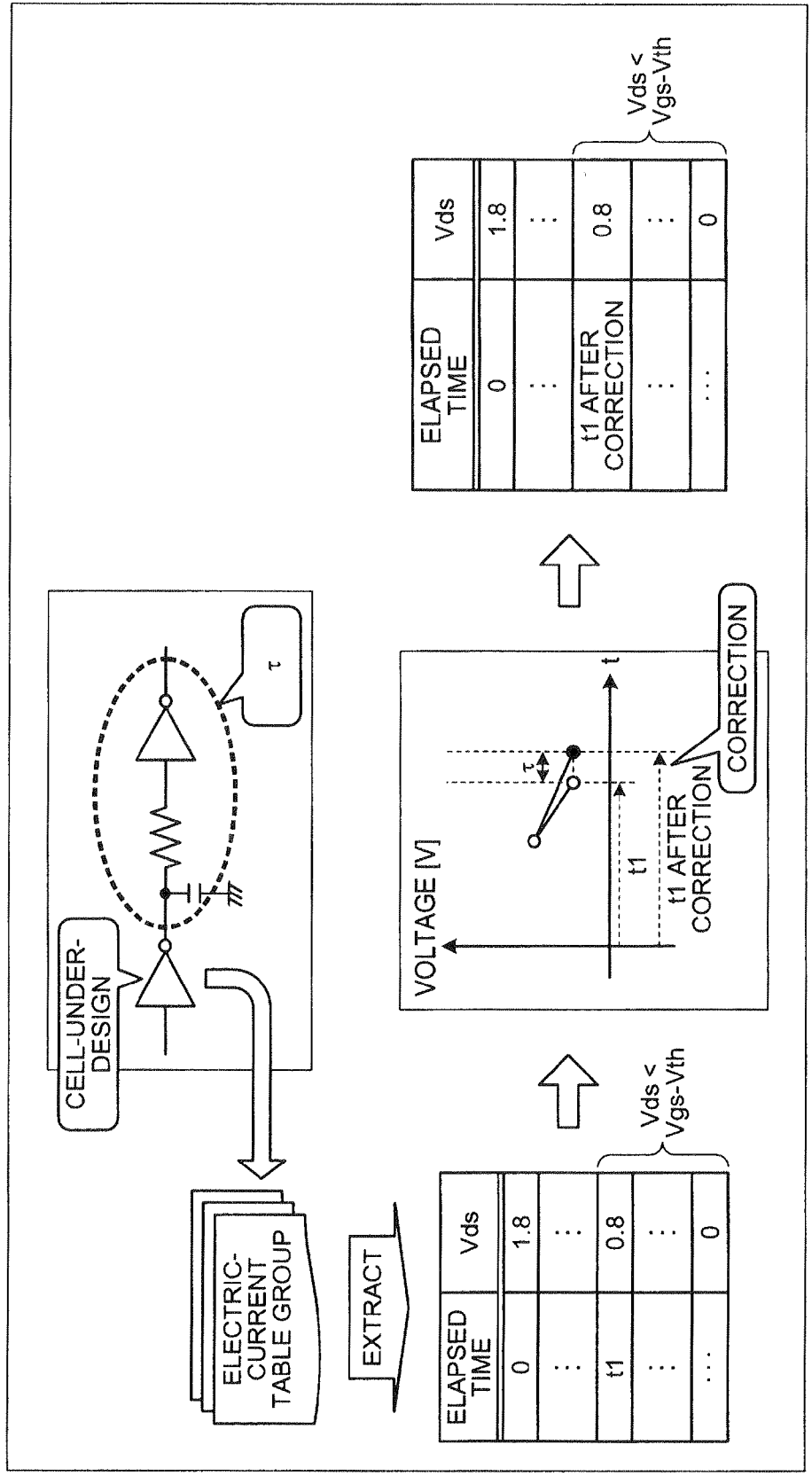
FIG. 1 is an explanatory diagram of an example of the present invention.

FIG. 1 is an explanatory diagram of an example of the present invention. An electric-current table group retains therein for each cell, values of the voltage output by the cell at the elapse of each time period from the time of the start of variation of an input voltage applied to the cell; and is stored in a storage device that is accessible by a design support apparatus. The output voltage value of the cell is a value calculated without taking into account the values of the load resistance and the load capacitance of the output of the cell.

The design support apparatus extracts based on an cell under design selected from among circuit information for a circuit under design, a value of the voltage at an elapse of a time period related to the cell under design; and determines an elapsed time period for Vds (output voltage) that is Vds<Vgs (input voltage)–Vth (gate threshold voltage) as an elapsed time period to be corrected. The embodiments will be described assuming that "Vin" is same as "Vgs".

The design support apparatus adds a time constant of the output from the cell under design to the elapsed time period to be corrected and thereby, corrects the elapsed time period. The "time constant" is a value that is calculated based on the values of the load resistance and the load capacitance of the output of the cell under design. The design support apparatus outputs the value of the voltage output at the elapse of each corrected time period, and the value of the voltage output at the elapse of each time period not determined as that to be corrected has elapsed.

In the first embodiment, exemplary creation of the electric-current table of a cell used in the circuit under design will be described. In the second embodiment, exemplary calculation of the delay time period of the cell under design selected from the circuit information of the circuit under design using the electric-current table created in the first embodiment will be described.

Figure 2:
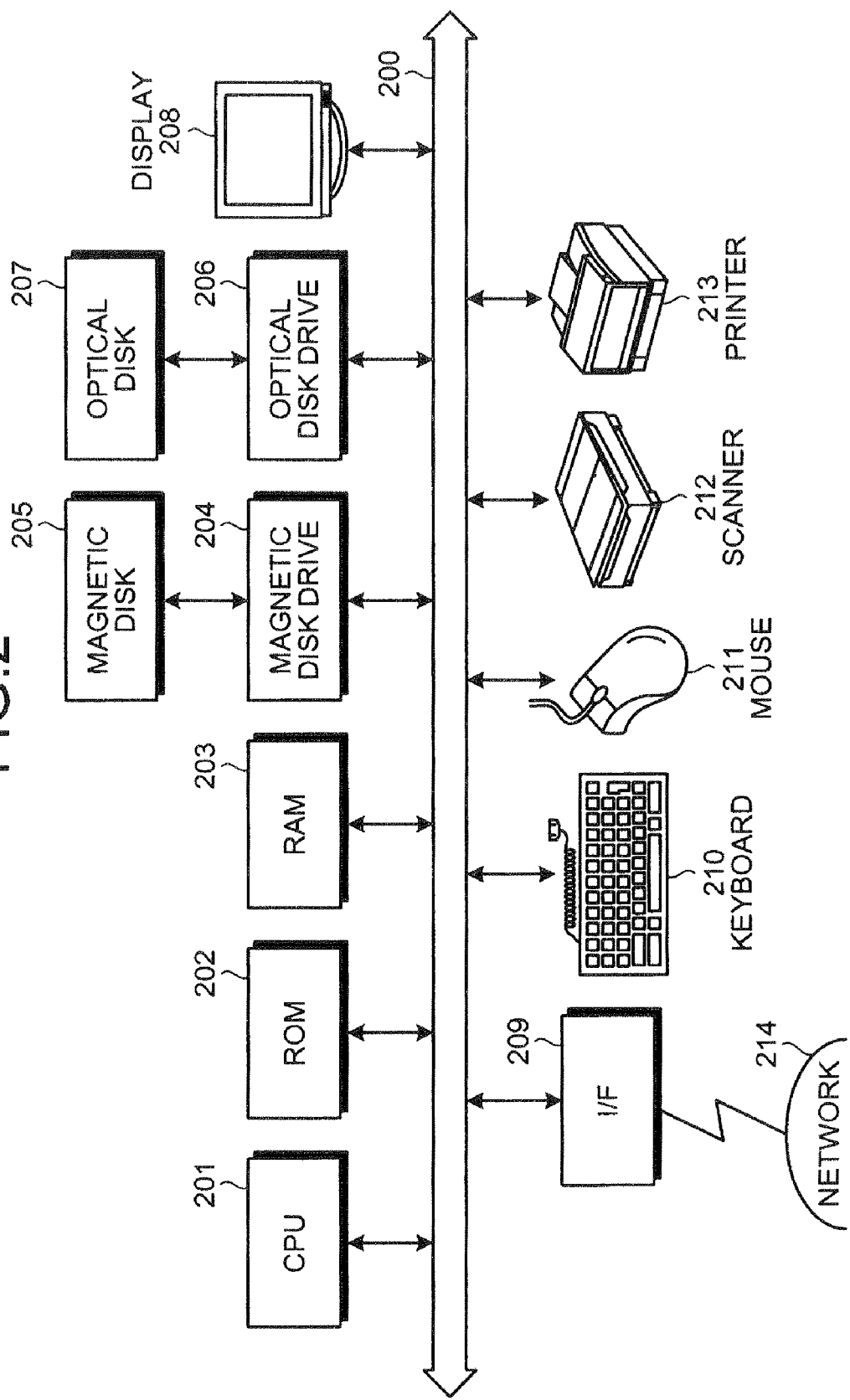
FIG. 2 is a block diagram of a hardware configuration of a design support apparatus according to embodiments.

FIG. 2 is a block diagram of a hardware configuration of a design support apparatus according to the embodiments. As depicted in FIG. 2, the design support apparatus includes a central processing unit (CPU) 201, a read-only memory (ROM) 202, a random access memory (RAM) 203, a magnetic disk drive 204, a magnetic disk 205, an optical disk drive 206, an optical disk 207, a display 208, an interface (I/F) 209, a keyboard 210, a mouse 211, a scanner 212, and a printer 213, respectively connected by a bus 200.

The CPU 201 governs overall control of the design support apparatus. The ROM 202 stores therein programs such as a boot program. The RAM 203 is used as a work area of the CPU 201. The magnetic disk drive 204, under the control of the CPU 201, controls the reading and writing of data with respect to the magnetic disk 205. The magnetic disk 205 stores therein data written under control of the magnetic disk drive 204.

The optical disk drive 206, under the control of the CPU 201, controls the reading and writing of data with respect to the optical disk 207. The optical disk 207 stores therein data written under control of the optical disk drive 206, the data being read by a computer.

The display 208 displays, for example, data such as text, images, functional information, etc., in addition to a cursor, icons, and/or tool boxes. A cathode ray tube (CRT), a thin-film-transistor (TFT) liquid crystal display, a plasma display, etc., may be employed as the display 208.

The I/F 209 is connected to a network 214 such as a local area network (LAN), a wide area network (WAN), and the Internet through a communication line and is connected to other apparatuses through the network 214. The I/F 209 administers an internal interface with the network 214 and controls the input/output of data from/to external apparatuses. For example, a modem or a LAN adaptor may be employed as the I/F 209.

The keyboard 210 includes, for example, keys for inputting letters, numerals, and various instructions and performs the input of data. Alternatively, a touch-panel-type input pad or numeric keypad, etc. may be adopted. The mouse 211 is used to move the cursor, select a region, or move and change the size of windows. A track ball or a joy stick may be adopted provided each respectively has a function similar to a pointing device.

The scanner 212 optically reads an image and takes in the image data into the design support apparatus. The scanner 212 may have an optical character reader (OCR) function as well. The printer 213 prints image data and text data. The printer 213 may be, for example, a laser printer or an ink jet printer.

FIG. 3 is a functional block diagram of the design support apparatus according to the first embodiment. The design support apparatus 300 includes an acquiring unit 301, a variation time period calculating unit 302, an elapsed time period calculating unit 303, and a storing unit 304. The CPU 201 loads therein a design support program having the functions (the acquiring unit 301 to the storing unit 304) and stored in a storage device such as the ROM 202, the RAM 203, the magnetic disk 205, or the optical disk 207 depicted in FIG. 2. The CPU 201 executes processes coded in the design support program, whereby the functions are realized.

The acquiring unit 301 acquires an output current value for each output voltage value, from the storage device that stores therein an output current value of a cell for each output voltage value of the cell, equal to or higher than a specific voltage value. The "specific voltage value" is, for example, a voltage value that is Vgs(Vin)–Vth.

The variation time period calculating unit 302 calculates a variation time period during which the output current value varies from that for the lowest voltage value among the output voltage values up to that for the highest voltage value thereof, based on a value of the junction capacitance of a transistor in the cell, a value of the gate threshold voltage (Vth) of the cell, and the output current values acquired by the acquiring unit 301.

The elapsed time period calculating unit 303 calculates for each output current value and based on the variation time period calculated by the variation time period calculating unit 302, the elapsed time period from the start of the variation of the input voltage applied to the cell.

The storing unit 304 stores to the storage device, the elapsed time period calculated for each output current value, by the elapsed time period calculating unit 303.

The acquiring unit 301 acquires an output current value for each output voltage value, from the storage device storing therein, for a cell, output current values for each output voltage value of the cell, lower than the specific voltage value. The specific voltage value is, for example, a value obtained by Vgs(Vin)−Vth.

Based on a value of the junction capacitance of the transistor in the cell, a value of the input voltage of the cell, and the output current value acquired by the acquiring unit 301, the variation time period calculating unit 302 calculates a variation time period during which the output current value varies from the lowest voltage value of the output voltage values up to the highest voltage value thereof.

The elapsed time period calculating unit 303 calculates for each output current value and based on the variation time period calculated by the variation time period calculating unit 302, an elapsed time period from the start of the variation of the input voltage.

The storing unit 304 stores to the storage device, the elapsed time period calculated for each output current value by the elapsed time period calculating unit 303.

Based on the above, an example of the creation of an electric-current table of an inverter will be described in detail.

FIG. 4 is an explanatory diagram of an example of PTV conditions. A PTV condition table 400 includes a PTV condition column 401, a process column 402, a temperature column 403, and a voltage column 404. The PTV condition column 401 indicates whether a condition is a TYP condition, a FAST condition, or a SLOW condition.

The conditions are as follows:

TYP Condition: a condition under which each cell operates at an ordinary speed;

FAST Condition: a condition under which each cell operates at the highest speed; and SLOW Condition: a condition under which each cell operates at the lowest speed.

Under the TYP condition, the process column 402 indicates "TYP condition (standard condition)", the temperature column 403 indicates "25° C. (ordinary temperature)", and the voltage column 404 indicates "1.8 [V]". Under the FAST condition, the process column 402 indicates "FAST condition (high speed condition)", the temperature column 403 indicates "−40° C. (low temperature)", and the voltage column 404 indicates "2.0 [V]". Under the SLOW condition, the process column 402 indicates "SLOW condition (low speed condition)", the temperature column 403 indicates "120° C. (high temperature)", and the voltage column 404 indicates "1.1 [V]". The PTV condition table 400 is stored in a storage device such as the RAM 203, the magnetic disk 205, or the optical disk 207. The numerical values and the PTV conditions in the PTV condition table 400 are merely an example.

FIG. 5 is an explanatory diagram of an example of a cell. In the first embodiment, the cell will be described taking an example of a cell of an inverter. In FIG. 5, the cell of the inverter whose inverter name is "INVERTER 1" is represented by a transistor description. The INVERTER 1 includes a P channel metaloxide semiconductor (PMOS) and an N channel metaloxide semiconductor (NMOS). A time difference between the an input voltage (Vin) input into an IN terminal and an output voltage (Vds) output from an OUT terminal is a delay time period. "C" depicted in FIG. 5 denotes junction capacitance (parasitic capacitance) in the INVERTER 1 and is different from the load capacitance of the output of the INVERTER 1.

"Vds", "Vds_nonRC", and "Vds_RC" used in the first and the second embodiments will be described. Vds, Vds_nonRC, and Vds_RC each represent output voltages that are output from the OUT terminal. "Vds" used in the first embodiment is an output voltage set by a user. "Vds_nonRC" used in the second embodiment is an output voltage that is calculated from the electric-current table created in the first embodiment. "Vds_RC" used in the second embodiment is an output voltage that is acquired by correcting Vds_nonRC, based on the load resistance and the load capacitance.

The first embodiment will be described taking an example of a case where there is a variation in the rising edge of the input to the IN terminal. A rising edge delay time period and a falling edge delay time period are symmetrical and therefore, an example of a case where there is a variation in the falling edge of the input to the IN terminal will not be described. In the first embodiment, an output current (Ids) at the OUT terminal when there is a rising edge variation in the input to the IN terminal is calculated and the calculation result is converted into a table.

Figure 6:
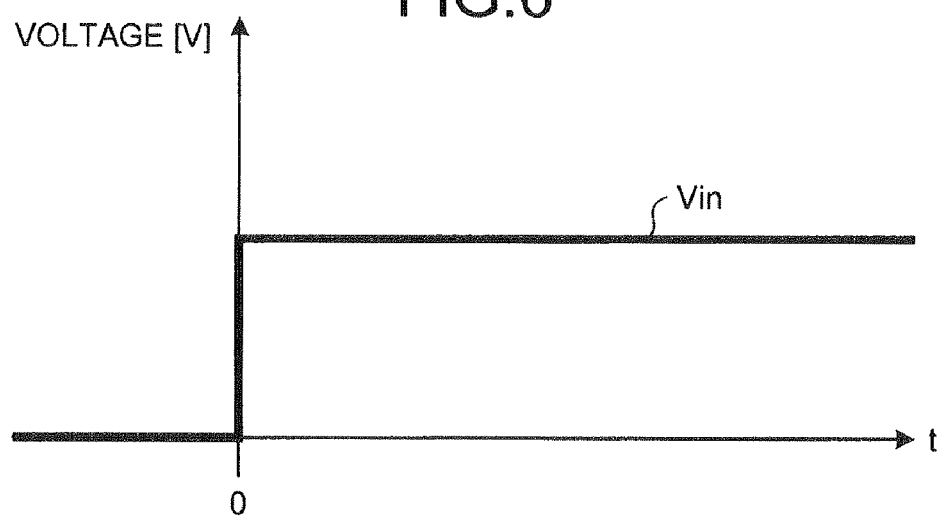
FIG. 6 is an explanatory diagram of an example of "Vin".

FIG. 6 is an explanatory diagram of an example of "Vin". In the first and the second embodiments, the start of the variation in Vin is set as t=0. In the first embodiment, Ids is acquired for each time period that has elapsed since the start of the variation. When Vin is Vin=0.0 [V] before t=0, Vds=Vdd and when the input of Vin rises at t=0, the PMOS immediately cuts off. Therefore, in this case, the description will be given noting only the NMOS.

As commonly known, a saturation region and a non-saturation region that are operational regions of a MOS are classified as follows.

Saturation Region: $Vds \geq Vgs-Vth$

Non-Saturation Region (Linear Region): $Vds < Vgs-Vth$

Equation (1) to calculate the current (Ids) output by the MOS when the operational region of the MOS is the saturation region and Equation (2) to calculate the current (Ids) output by the MOS when the operational region of the MOS is the non-saturation region are given as follows.

$$Ids = \frac{1}{2} \mu 0 Cox \left(\frac{W}{L}\right)(Vgs - Vth)^2 \quad (1)$$

$$Ids = \mu 0 Cox \left(\frac{W}{L}\right)\left((Vgs - Vth)Vds - \frac{1}{2}Vds^2\right) \quad (2)$$

Equations (1) and (2) are stored in a storage device such as the RAM 203, the magnetic disk 205, or the optical disk 207. Parameters are as follows.

"μ" [cm^2/(V×s)]: carrier mobility

"∈0" (Epsilon Zero) [F/cm]: vacuum dielectric constant

"∈ox" (Epsilon ox) [F/cm]: relative dielectric constant

"Tox" [m]: oxide film thickness

"Cox" [F]: gate capacitance

"W" [m]: gate width

"L" [m]: gate length

"C" [F]: junction capacitance (parasitic capacitance)

FIG. 7 is an explanatory diagram of a transistor property table. The transistor property table 700 includes tables 701 and 712. The transistor property table 700 is stored in a storage device such as the magnetic disk 205 or the optical disk 207.

The table 701 stores therein the parameters for each MOS in the INVERTER 1 and includes a transistor column 702, a μ column 703, a Cox column 704, an ∈0 column 705, an ∈ox column 706, a Tox column 707, a W/L column 708, a W column 709, an L column 710, and a C column 711.

The transistor column 702 retains therein the type of each MOS in the INVERTER 1. The μ column 703 retains therein "μ". The Cox column 704 retains therein "Cox". The ∈0 column 705 retains therein "∈0". The ∈ox column 706 retains therein "∈ox". The Tox column 707 retains therein "Tox". The W column 709 retains therein "W". The L column 710 retains therein "L". The C column 711 retains therein "C".

The W/L column 708 retains therein a ratio of W retained in the W column 709 to L retained in the L column 710. For example, "35.42E-06" retained in the Cox column 704 indicates 35.42×10^(−6). "^" represents a power.

The table 712 includes a transistor column 713 and a Vth column 714. The transistor column 713 retains therein the type of each MOS in the INVERTER 1. The Vth column 714 stores therein Vth (gate threshold voltage) of each transistor in the INVERTER 1 for each PTV condition.

For example, the CPU 201 selects a specific PTV condition, from the PTV condition table 400. Alternatively, for example, the CPU 201 sequentially selects the PTV conditions, from the PTV condition table 400. In the first embodiment, the TYP condition will be described as an example, i.e., "Vdd" is 1.8 [V].

FIG. 8 is an explanatory diagram of an example of Vds. A table 800 includes a Vds column 801 that retains therein Vds. As depicted in FIG. 8, in the first embodiment, Vds varies from 1.8 to 0.0 [V] in steps of 0.1 [V] and Ids is calculated using Equations (1) and (2). When Vds is between 1.8 and 1.5 [V], the operational region of the INVERTER 1 is the saturation region and therefore, Ids is calculated using Equation (1). When Vds is between 1.4 and 0.0 [V], the operational region of the INVERTER 1 is non-saturation region and therefore, Ids is calculated using Equation (2).

For example, the CPU 201 acquires Equation (1), from the storage device; acquires the parameters in Equation (1), from the transistor property table 700; sets the parameters in Equation (1); and calculates Ids for the operational region of the NMOS, the saturation region. In other words, Ids is calculated for Vds, which is between 1.8 and 1.5 [V]. In the saturation region, Ids has the same electric-current value regardless of the value of Vds. The calculation result is stored to a storage device such as the RAM 203, the magnetic disk 205, or the optical disk 207.

For example, the CPU 201 acquires Equation (2), from the storage device; acquires the parameters in Equation (2), from the transistor property table 700; sets the parameters in Equation (2); acquires Vds (1.4 to 0.0 [V]) sequentially from the table 800; sets the acquired Vds in Equation (2); and calculates Ids in the non-saturation region, for each Vds (1.4 to 0.0 [V]). The calculation result is stored to a storage device such as the RAM 203, the magnetic disk 205, or the optical disk 207.

Figure 9:
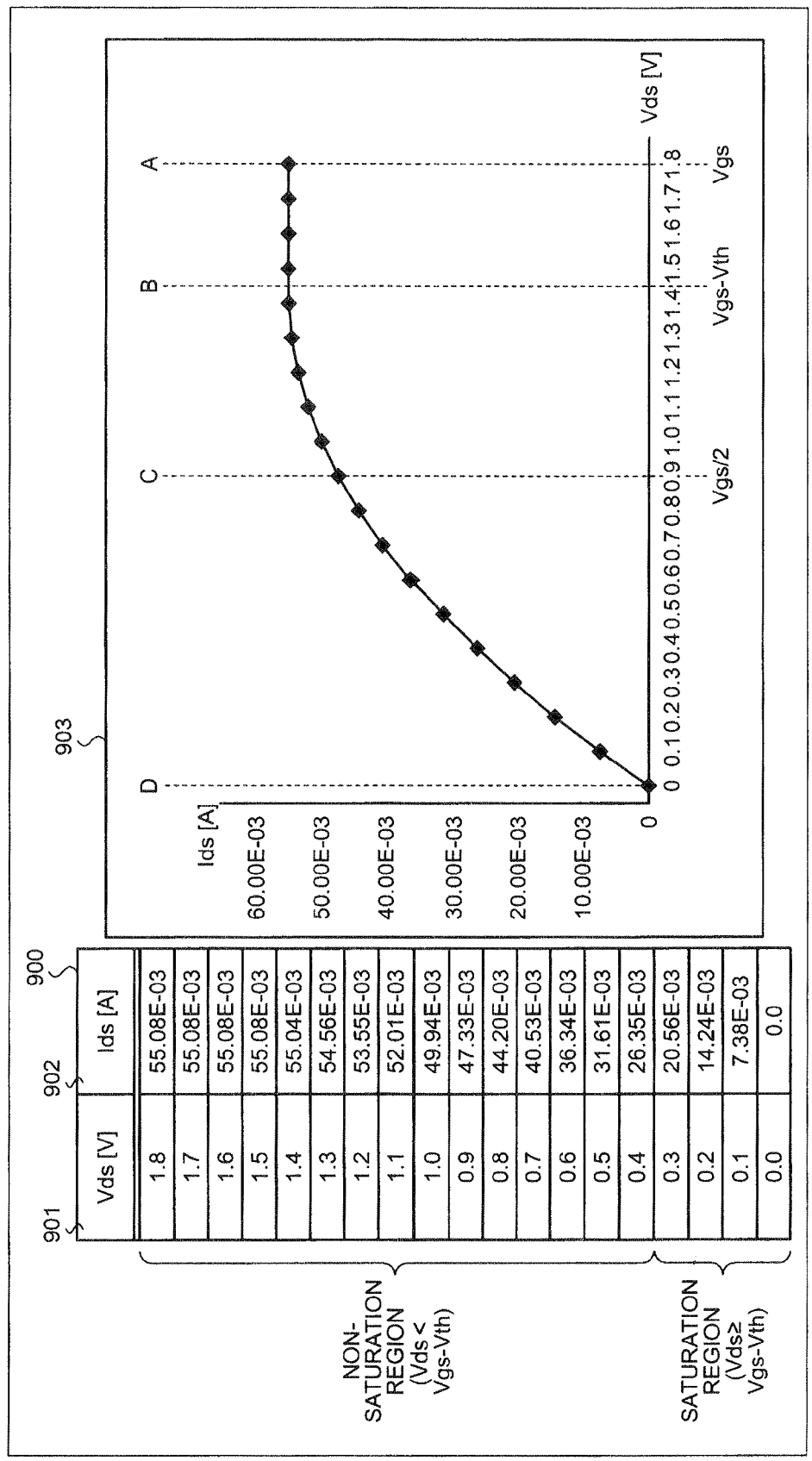
FIG. 9 is an explanatory diagram of an example of Ids for each Vds.

FIG. 9 is an explanatory diagram of an example of Ids for each Vds. A table 900 presents Ids for each Vds and includes a Vds column 901 and an Ids column 902. The Vds column 901 retains therein Vds and the Ids column 902 retains therein Ids for the Vds.

In a graph 903, the axis of abscissa represents Vds [V]; the axis of ordinate represents Ids [A]; the electric-current value is high when Vds is high; and the electric-current value is low when Vds is low. For example, a point at which Vds is Vds=Vgs is referred to as "point A", a point at which Vds is Vds=Vgs−Vth is referred to as "point B", a point at which Vds is Vds=Vgs/2 is referred to as "point C", and a point at which Vds is Vds=0 is referred to as "point D".

In the first embodiment, time periods during which the output current of the INVERTER 1 varies from the point A to the point B is denoted by "tAB"; from the point B to the point C is denoted by "tBC"; and from the point C to the point D is denoted by "tCD". The time period tAB is calculated by using Equation (3) as follows from Equation (1).

$$tAB = \frac{CVgs - C(Vgs - Vth)}{Ids} \qquad (3)$$

$$= \frac{CVth}{\frac{1}{2}\mu 0 Cox\left(\frac{W}{L}\right)(Vgs - Vth)^2}$$

The time period tBC will be described. The time integral of an electric current is an electric charge and therefore, Equation (4) is obtained from an equation to calculate Ids in the non-saturation region.

$$Ids \cdot dt = -C \cdot dVds \qquad (4)$$

$$\frac{\mu 0 Cox\left(\frac{W}{L}\right)}{2C} dt = \frac{1}{2(Vgs - Vth)} \cdot \frac{dVds}{\frac{Vds^2}{2(Vgs - Vth)} - Vds} \qquad (5)$$

Because Equation (5) is derived from Equation (4), the left-hand side of Equation (5) is integrated from zero to tBC and the right-hand side thereof is integrated from Vgs−Vth to ½×Vgs and thereby, Equation (6) is obtained.

$$tBC = \frac{C}{\mu 0 Cox\left(\frac{W}{L}\right)(Vgs - Vth)} \ln\left(\frac{3Vgs - 4Vth}{Vgs}\right) \qquad (6)$$

Equations (3) and (6) are stored to a storage device such as the RAM 203, the magnetic disk 205, or the optical disk 207.

For example, the CPU 201 acquires Equation (3), from the storage device using the variation time period calculating unit 302; acquires the parameters in Equation (3), from the transistor property table 700; sets the parameters in Equation (3); and calculates the time period tAB. For example, the CPU 201 acquires Equation (6), from the storage device, using the variation time period calculating unit 302; acquires the parameters in Equation (6), from the transistor property table 700; sets the parameters in Equation (6); and calculates the time period tBC.

The calculation results are indicated below.
tAB: 3.279535511146584E-12
tBC: 5.17154782518248E-12

For example, the CPU 201 converts Ids for each Vds into Ids for each elapsed time period, based on the time periods tAB and tBC calculated.

Figure 10:
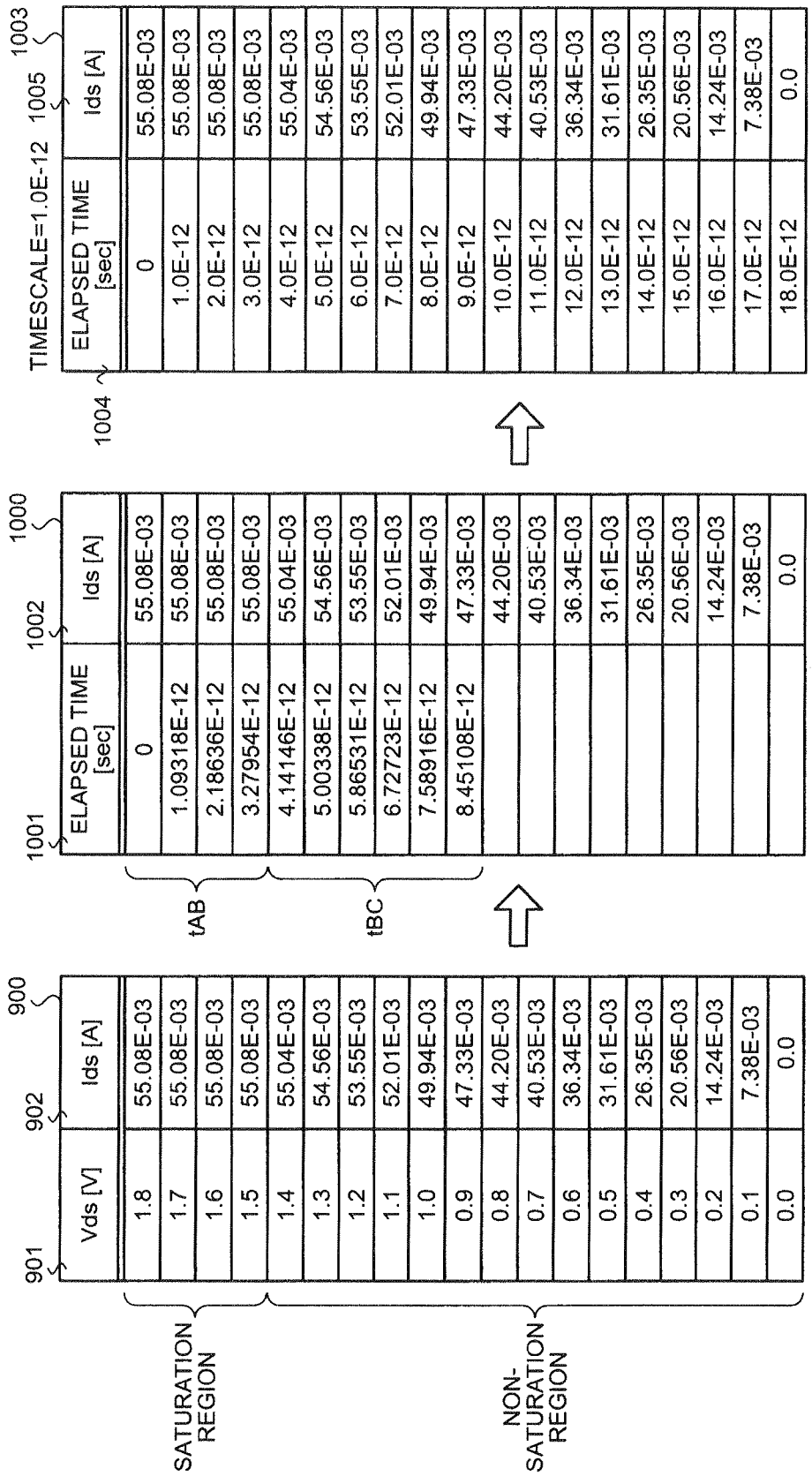
FIG. 10 is an explanatory diagram of Ids for each elapsed time period.

FIG. 10 is an explanatory diagram of Ids for each elapsed time period. A time period that has elapsed from the start of variation of Vin is referred to as "elapsed time period". In the embodiment, tAB is a variation time period during which the output current value varies from 1.8 to 1.5 [V] and therefore, the CPU 201 calculates, for example, as follows, the elapsed time period for each Vds (or each Ids), using the elapsed time period calculating unit 303.

The elapsed time period [sec] when Vds is 1.8 [V]: 0
The elapsed time period [sec] when Vds is 1.7 [V] tAB/3
The elapsed time period [sec] when Vds is 1.6 [V]: tAB/3+(the elapsed time period for 1.7 [V])
The elapsed time period [sec] when Vds is 1.5 [V]: tAB/3+(the elapsed time period for 1.6 [V])

tBC is a variation time period during which the output current value varies from 1.4 [V] to 0.9 [V] and therefore, the CPU 201 calculates, for example, as follows, the elapsed time period for each Vds (or each Ids).

The elapsed time period [sec] when Vds is 1.4 [V]: tBC/6+(the elapsed time period for 1.5 [V])
The elapsed time period [sec] when Vds is 1.3 [V]: tBC/6+(the elapsed time period for 1.4 [V])
The elapsed time period [sec] when Vds is 1.2 [V]: tBC/6+(the elapsed time period for 1.3 [V])
The elapsed time period [sec] when Vds is 1.1 [V]: tBC/6+(the elapsed time period for 1.2 [V])
The elapsed time period [sec] when Vds is 1.0 [V]: tBC/6+(the elapsed time period for 1.1 [V])
The elapsed time period [sec] when Vds is 0.9 [V]: tBC/6+(the elapsed time period for 1.0 [V])

An example of Ids for each elapsed time period is a table 1000. The table 1000 includes an elapsed time period column 1001 and an Ids column 1002. The table 1000 retains therein an elapsed time period for each Ids from 1.8 to 0.9 Dn.

Assuming that the resolution (TIME SCALE) is 0E-12 [sec], an example of the elapsed time period for each Ids is an electric-current table 1003. The electric-current table 1003 includes an elapsed time period column 1004, an Ids column 1005, and a Vin column 1006. The Vin column 1006 is not depicted in FIG. 10.

An input threshold or an output threshold for calculating the delay time period is Vdd×50[%], and is Vds (for Vdd that is Vdd=Vds)×50[%] or less for a section from the point C to the point D. In the electric-current table 1003, TIME SCALE is allocated following the steps of Vds from the table 900 for the section from the point C to the point D. Not limited hereto, the operational region of the section from the point C to the point D is the non-saturation region and therefore, for example, a user may also create in advance a calculation equation similarly to the calculation for the section from the point B to the point C and also calculate tCD. The CPU 201 stores the electric-current table 1003 in a storage device such as the RAM 203, the magnetic disk 205, or the optical disk 207, using the storing unit 304.

Calculation of an internal resistance (rDS) of the NMOS in the INVERTER 1 will be described. For example, the CPU 201 calculates rDS by dividing Vds by Ids.

Figure 11:
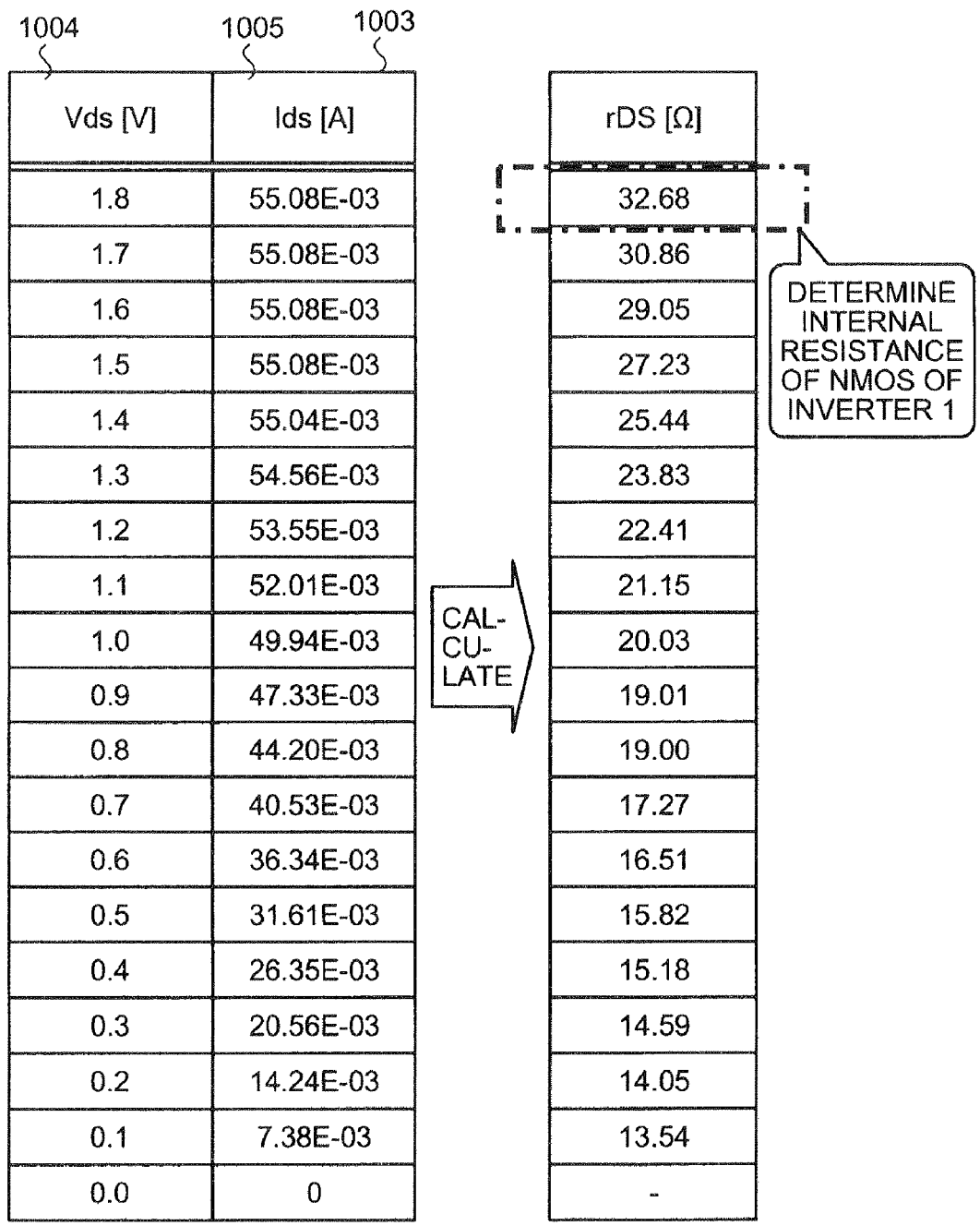
FIG. 11 is an explanatory diagram of a calculation result of rDS.

FIG. 11 is an explanatory diagram of the calculation result of rDS. For example, the CPU 201 calculates rDS for each Vds by dividing Vds by Ids calculated for each Vds. In this case, rDS acquired when the Vds is Vds=1.8 [V] is determined as the value of the internal resistance of the NMOS in the INVERTER 1. rDS is stored in a storage device such as the RAM 203, the magnetic disk 205, or the optical disk 207.

Creation of an electric-current table taking into account influences of "tr" and "tf" will be described. "tr" represents a time period necessary for a rising edge of the input voltage (Vin) to rise and "tf" represents a time period necessary for a falling edge of the input voltage (Vin) to fall.

Figure 12:
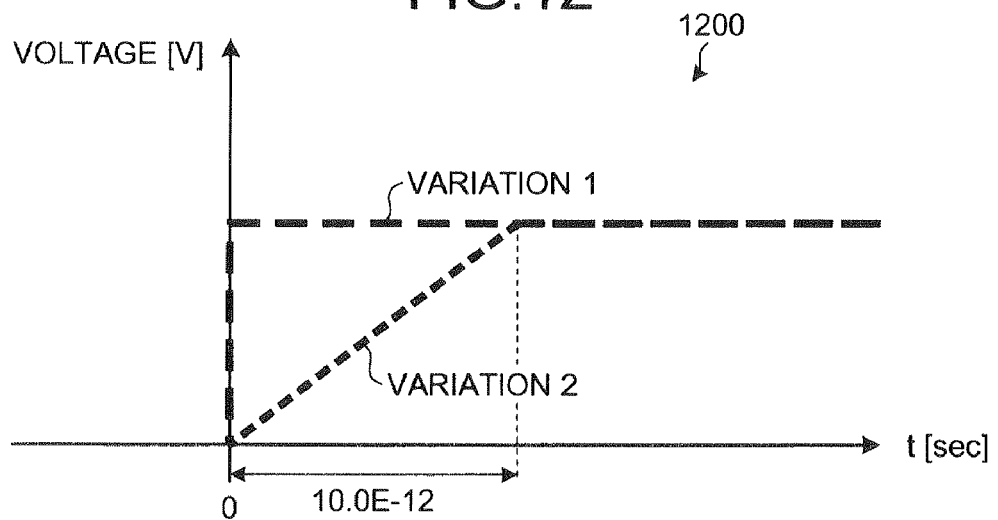
FIG. 12 is an explanatory diagram of another example of Vin.

FIG. 12 is an explanatory diagram of another example of Vin. A graph 1200 presents two examples of the variation of Vin, variations 1 and 2. Variation 1 depicts Vin that rises without any delay similarly to Vin depicted in FIG. 6. In variation 1, tr is zero. On the other hand, in variation 2, a time period of 10E-12 [sec] is necessary for Vin to vary from 0.0 to Vdd [V]. In the variation 2, tr is 10E-12 [sec]. Reflecting the tr in the electric-current table 1003 gives the following.

Figure 13:
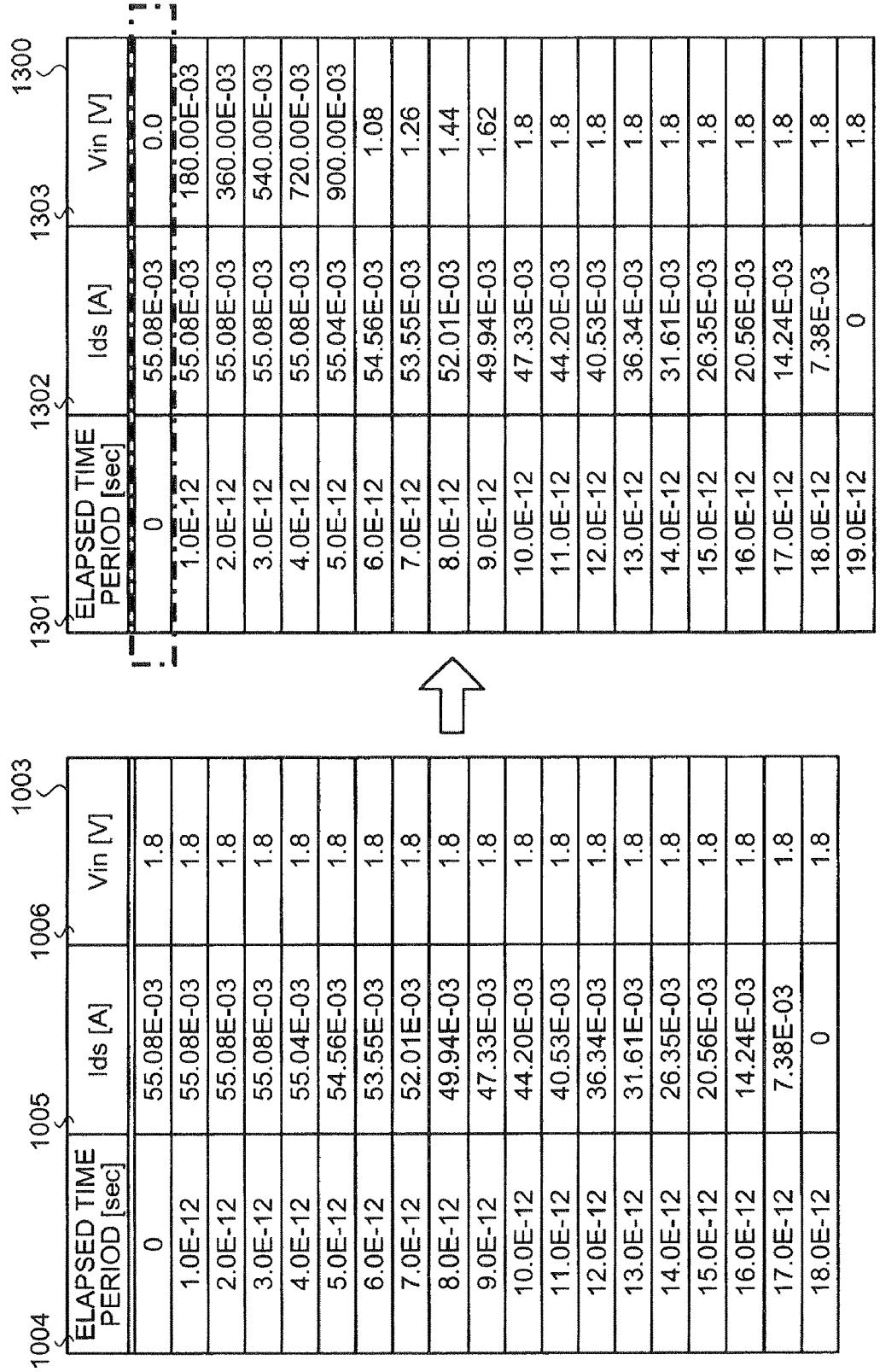

FIG. 13 is an explanatory diagram of an exemplary reflection of an input through. In this case, for example, it is assumed that a delay time period that depends on the input through is a part of tr for Vin to reach Vth. The delay time period depending on the input through is 10E-12/1.8×0.36 (tr/Vdd×Vth)=2.0E-12 [sec]. For example, the CPU 201 can create an electric-current table 1300 by adding the delay time period of 2.0E-12 to the electric-current table 1003.

The electric current table 1300 includes an elapsed time period column 1301, an Ids column 1302, and a Vin column 1303. The elapsed time period column 1301 retains therein an elapsed time period. The Ids column 1302 retains therein Ids. The Vin column 1303 retains therein Vin. The Vin column 1303 has a value set therein such that the Vin is 1.8 [V] when the elapsed time period is 10E-12 [sec].

For example, the CPU 201 outputs the electric-current tables 1003 and 1300. The form of the output can be, for example, display on the display 208, output to the printer 213 for printing, or transmission to an external apparatus by the I/F 209. The electric-current tables 1003 and 1300 may be stored to a storage device such as the RAM 203, the magnetic disk 205, or the optical disk 207.

Figure 14:
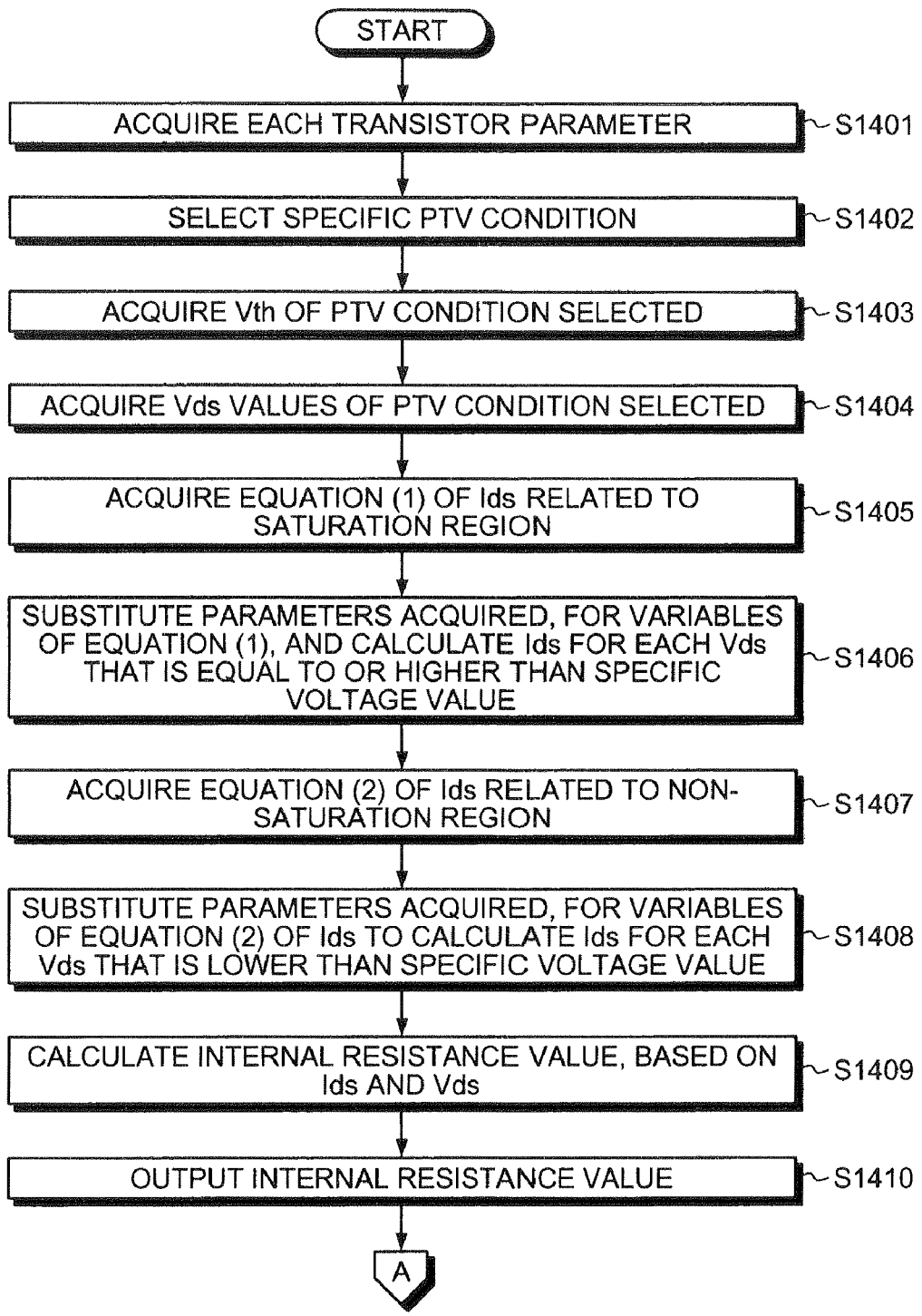
FIGS. 14 and 15 are flowcharts of an example of a process procedure for design support by the design support apparatus according to the first embodiment.
Figure 15:
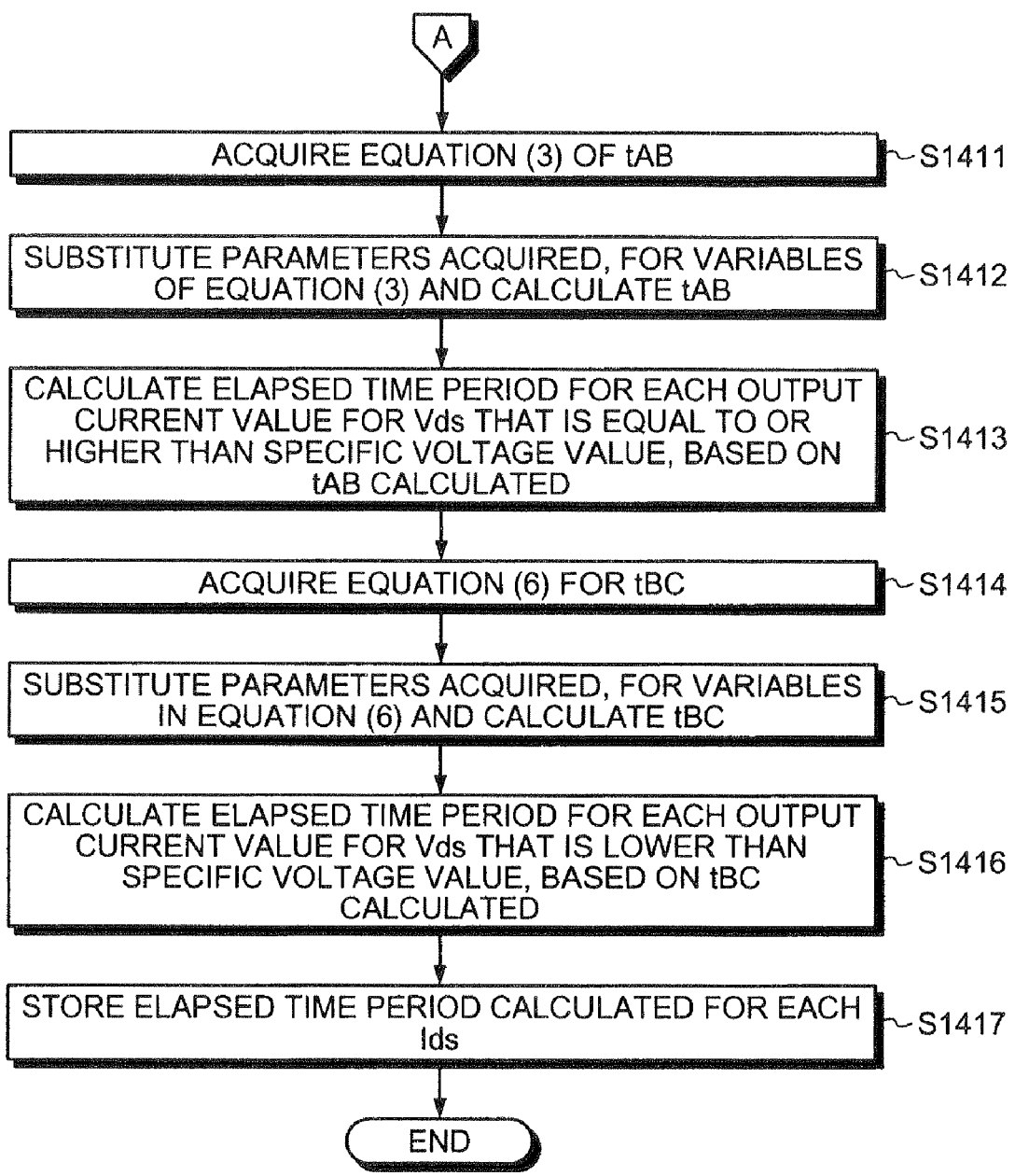

FIGS. 14 and 15 are flowcharts of an example of the process procedure for the design support by the design support apparatus 300 according to the first embodiment. The CPU 201 first acquires the parameters of the transistor (step S1401), selects the specific PTV condition from among the PTV conditions (step S1402), and acquires Vth under the PTV condition selected (step S1403).

The CPU 201 acquires the Vds values under the PTV condition selected (step S1404) and acquires Equation (1) for calculating Ids related to the saturation region (step S1405). The CPU 201 substitutes the parameters acquired, for variables in Equation (1) and calculates Ids for each Vds that is equal to or higher than the specific voltage value among the of Vds values (step SS1406). As described, the specific voltage value is obtained by Vgs(Vin)−Vth.

The CPU 201 acquires Equation (2) to calculate Ids related to the non-saturation region (step S1407). The CPU substitutes the parameters acquired, for variables in Equation (2) and calculates Ids for each Vds that is lower than the specific voltage value among the Vds values (step S1408). The CPU 201 calculates the value of the internal resistance based on Ids and Vds (step S1409) and outputs the value of the internal resistance (step S1410).

The CPU 201 acquires Equation (3) to calculate tAB (step S1411); substitutes the parameters acquired, for variables in Equation (3); calculates tAB (step S1412); and calculates the elapsed time period for each output current value for Vds that is equal to or higher than the specific voltage value, based on tAB calculated (step S1413).

The CPU 201 acquires Equation (6) to calculate tBC (step S1414); substitutes the parameters acquired, for variables in Equation (6); calculates tBC (step S1415), and calculates the elapsed time period of each output current value for Vds that is lower than the specific voltage value, based on tBC calculated (step S1416).

The CPU 201 stores the elapsed time period calculated for each Ids (step S1417) and the series of process steps comes to an end.

In the second embodiment, exemplary calculation will be described of a delay time period of the cell under design in the circuit information of the circuit under design, using the electric-current tables that are created in the first embodiment. The second embodiment includes the same hardware as that are described in the first embodiment and therefore, the hardware components are given the same reference numerals used in the first embodiment and will not again be described.

Figure 16:
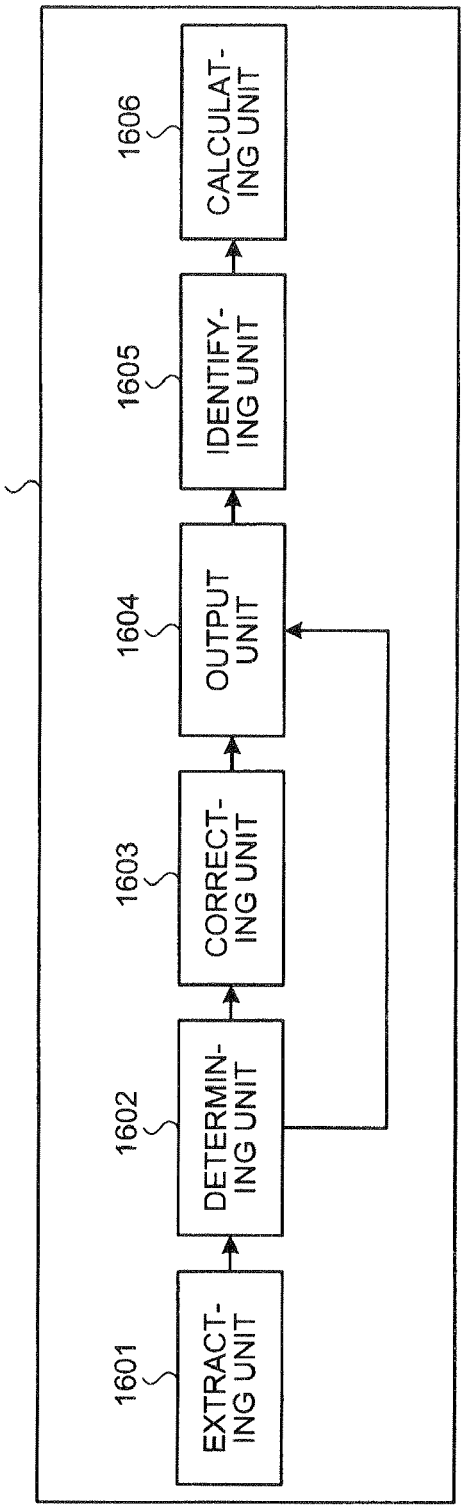
FIG. 16 is a functional block diagram of a design support apparatus according to a second embodiment.

FIG. 16 is a functional block diagram of a design support apparatus according to the second embodiment. The design support apparatus 1600 includes an extracting unit 1601, a determining unit 1602, a correcting unit 1603, an output unit 1604, an identifying unit 1605, and a calculating unit 1606. The CPU 201 loads therein a design support program having the functions (the extracting unit 1601 to the calculating unit 1606) and stored in a storage device such as the ROM 202, the RAM 203, the magnetic disk 205, or the optical disk 207 depicted in FIG. 2. The CPU 201 executes processes coded in the design support program, whereby the functions are realized.

From the storage device that stores therein for each cell, the value of the voltage output from the cell at the elapse of each time period from the time of the start of the variation of the input voltage applied to the cell, the extracting unit 1601 extracts based on the cell under design selected from the circuit information of the circuit under design, a value of the voltage output at the elapse of each time period related to the cell under design.

From among the elapsed time periods for output voltage values that are extracted by the extracting unit 1601, the determining unit 1602 determines an elapsed time period to be corrected, based on the specific voltage value. The "specific voltage value" is the value acquired by Vgs(Vin)−Vth.

The correcting unit 1603 adds a time constant of the output of the cell under design to the elapsed time period that is determined by the determining unit 1602.

The output unit 1604 outputs an output voltage value for each elapsed time period after correction by the correcting unit 1603 and an output voltage value for each elapsed time period that is not determined by the determining unit 1602.

The identifying unit 1605 identifies an elapsed time period for an output voltage value that is a threshold of the output voltage of the cell under design, from among the output voltage values output by the output unit 1604.

The calculating unit 1606 calculates the time difference between an elapsed time period from the start of the variation of the input voltage applied to the cell under design until the input voltage reaches a threshold of the input voltage, and the elapsed time period that is identified by the identifying unit 1605.

The identifying unit 1605 identifies an elapsed time period for an output voltage value that is the threshold of the input voltage of the downstream cell of the cell under design, from among the output voltage values output by the output unit 1604.

The calculating unit 1606 calculates the time difference between an elapsed time period during which the input voltage reaches the threshold of the input voltage, from the start of the variation of the input voltage applied to the cell under design, and the elapsed time period that is identified by the identifying unit 1605.

The embodiment will be described in detail based on the above.

Figure 17:
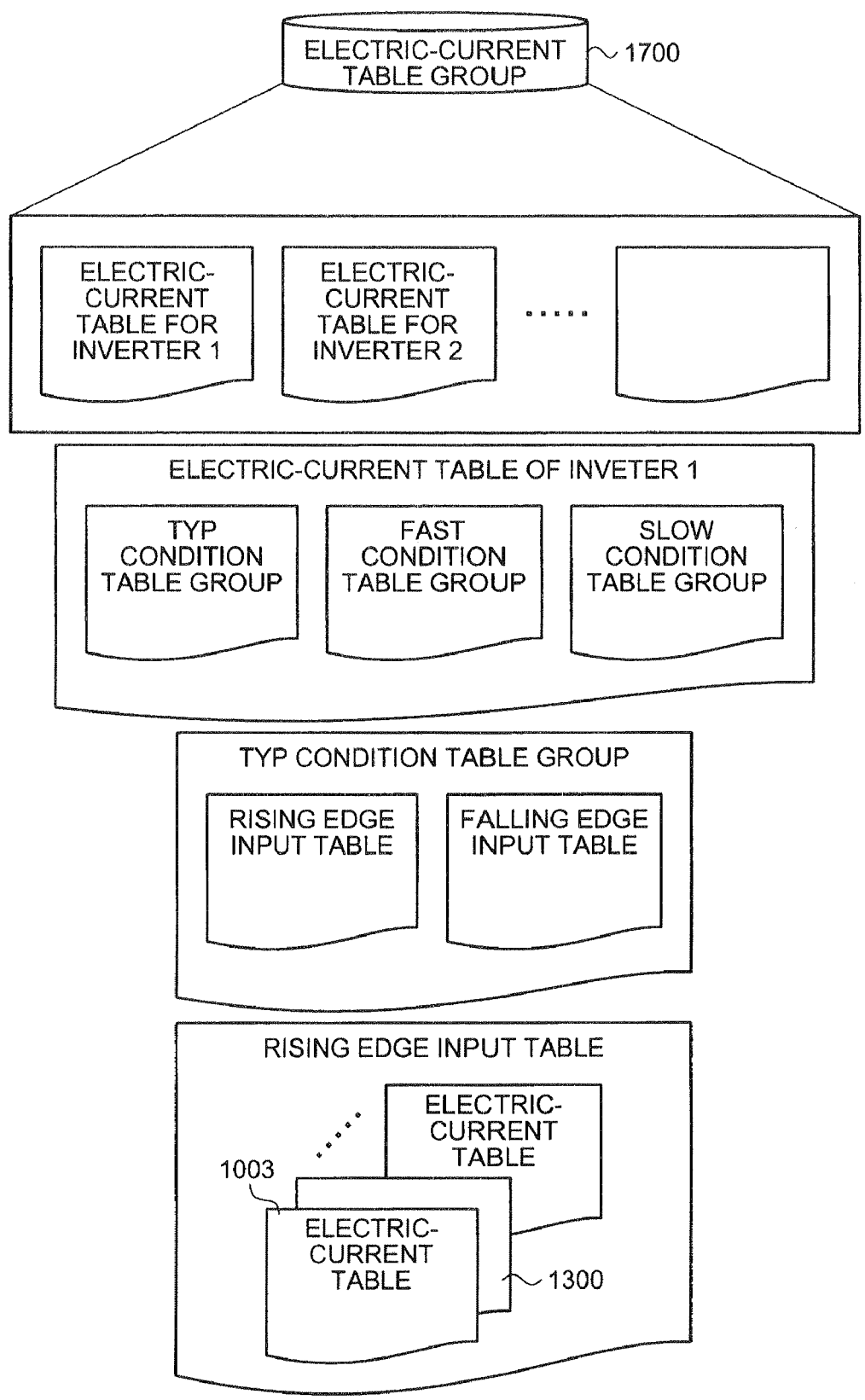
FIG. 17 is an explanatory diagram of an example of an electric-current table group.

FIG. 17 is an explanatory diagram of an example of the electric-current table group. An electric-current table group 1700 includes an electric-current table for each cell. Taking an example of the INVERTER 1, the electric-current table group 1700 includes electric-current tables for cells such as the electric-current tables of the INVERTERs 1 and 2. The electric-current table group of the INVERTER 1 includes a TYP condition table group, a FAST condition table group, and a SLOW condition table group. The TYP condition table group includes a rising edge input table and a falling edge input table.

The falling edge input table includes tables for tf time periods. The rising edge input table includes tables for tr time periods. The rising edge input table group includes, for example, the electric-current tables 1003 and 1300 described in the first embodiment. The electric-current table group 1700 is stored in the RAM 203, the magnetic disk 205, or the optical disk 207.

Figure 18:
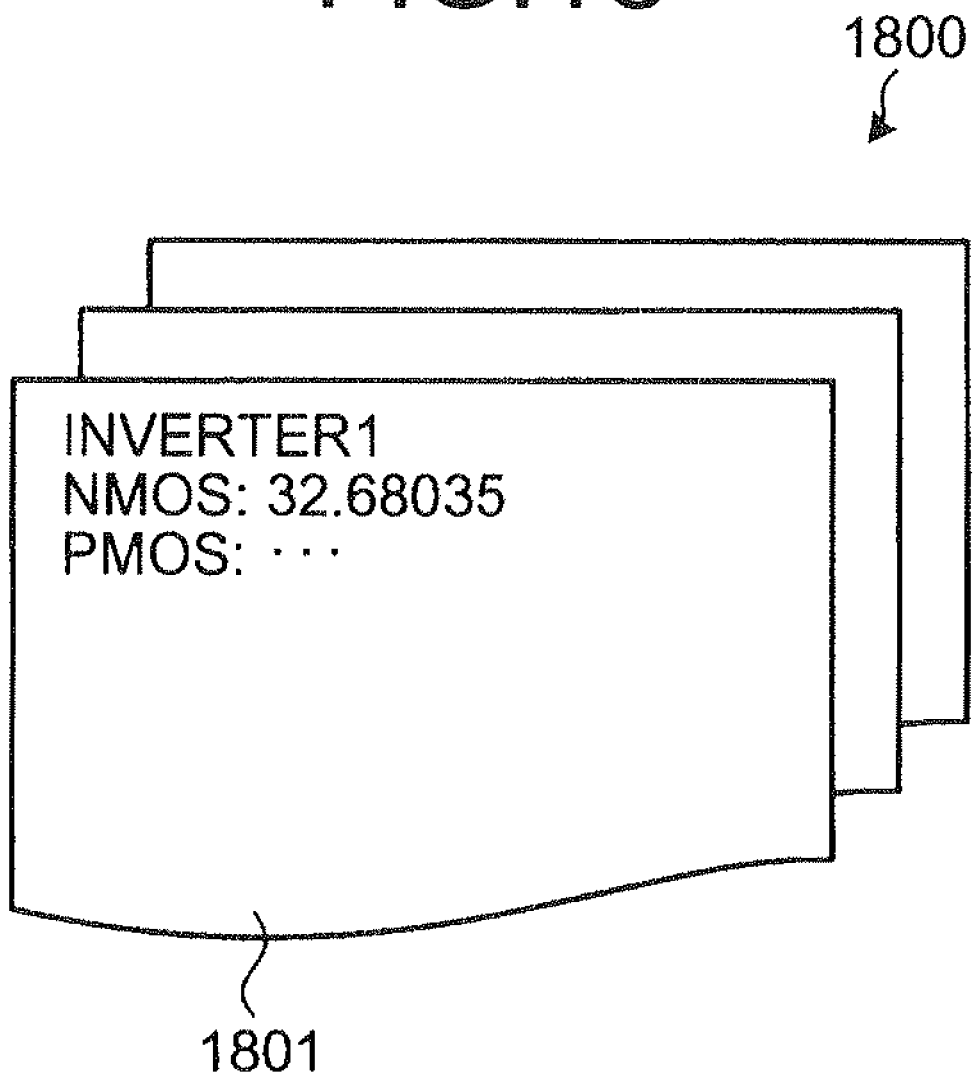
FIG. 18 is an explanatory diagram of an example of an internal resistance table group.

FIG. 18 is an explanatory diagram of an example of an internal resistance table group. The internal resistance table group 1800 retains therein for each cell, the value of an internal resistance of a MOS in the cell. For example, an internal resistance table 1801 retains therein the values of the internal resistances of the NMOS and the PMOS of the INVERTER 1.

In the second embodiment, a table is calculated that includes an output voltage value for each elapsed time period of an cell under design selected from the circuit information of the circuit under design, based on the table 1300 including the output current value for each elapsed time period and the internal resistance table 1801. Not limited hereto, a user may create in advance a table including the output voltage value for each elapsed time period for each cell.

Figure 19:
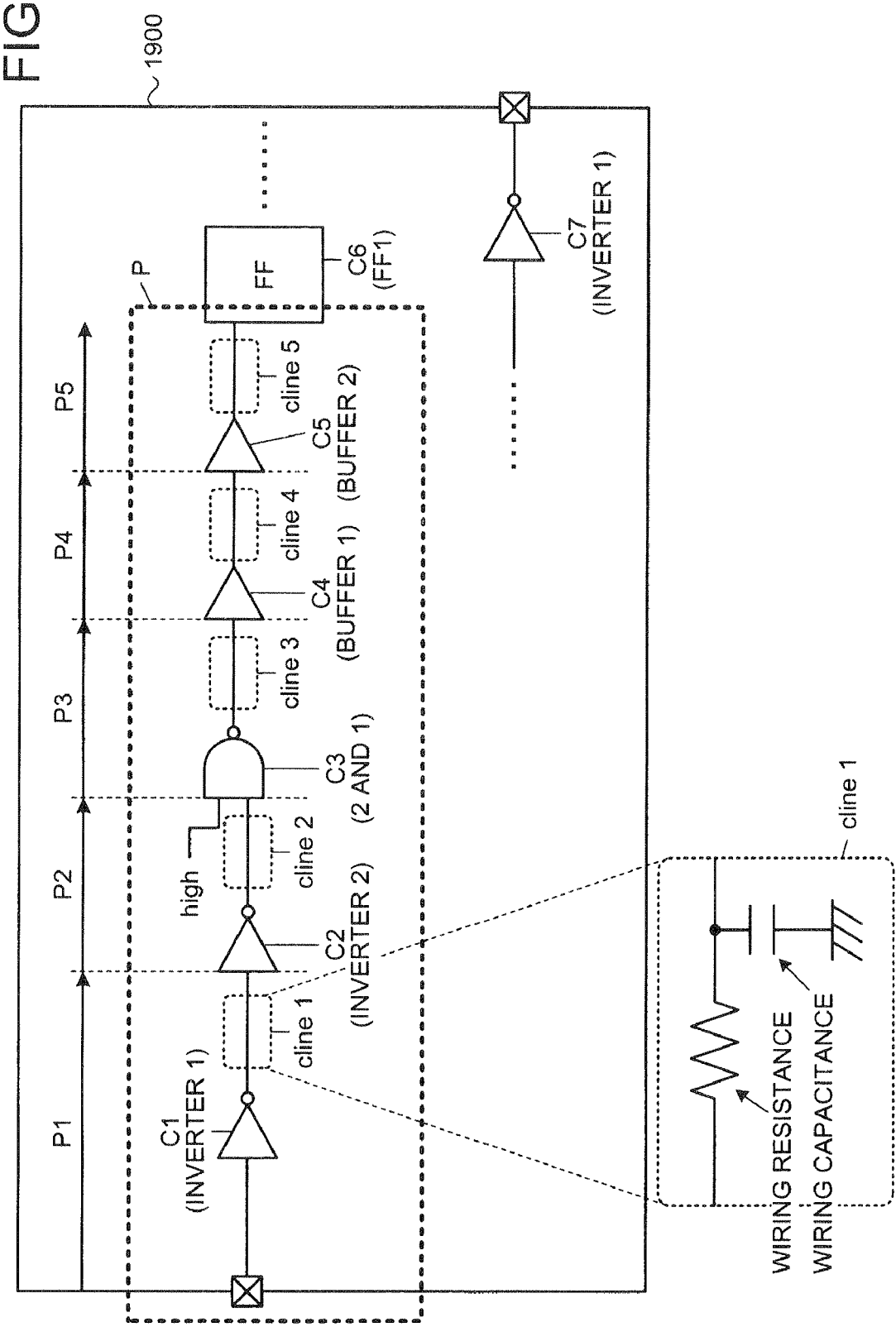
FIG. 19 is an explanatory diagram of an example of circuit information of a circuit under design.

FIG. 19 is an explanatory diagram of an example of the circuit information of the circuit under design. Circuit information 1900 is electronic data that includes connection information of cells in the circuit under design and for example, is layout data of the circuit under design or a net list of the circuit under design acquired after the logic synthesis. The circuit information 1900 includes cells C1 to C7.

An "instance name" is a specific name of each cell in the circuit under design. A "cell name" is a name to represent the type of cell. "Cells C1 to C7" are instance names. "INVERTERs 1 and 2", "2AND1" (an AND having two inputs and one output), "BUFFERs 1 and 2", and "FF 1" are cell names.

For example, elements like the INVERTERs 1 and 2 are both inverters and employ the same logic, but have differing performance. For example, the cells 1 and 7 each have a different instance name although each is the INVERTER 1. In the second embodiment, the cells C1 and C7 have the same cell name while the wiring from the output of each cell and the downstream cell of the cell are different from that of each other and therefore, the time constant of each cell is different from that of each other, and the upstream cell of the cell is different from that each other and therefore, the input through of each cell is different from that of each other. Therefore, different delay time periods are calculated for the cells C1 and C7.

For example, the CPU 201 calculates a delay time period for each of the cells C1 to C5 on a path P, totals the delay time periods calculated and thereby, can calculate a delay time period of the path P. For example, the CPU 201 divides the path P into sub-paths for the cells, obtaining paths P1 to P5 and calculates the delay time period of each sub-path.

A "path" is a set of a series of cells and nets from an input terminal to a macro (for example, Flip-Flop (FF)) or a set of a series of cells and nets between macros (for example, FFs).

Alternatively, a "path" is a set of a series of cells and nets from a macro to an output terminal.

The wiring from the output of the cell C1 is cline 1, that of the cell C2 is cline 2, that of the cell C3 is cline 3, that of the cell C4 is cline 4, and that of the cell C5 is cline 5. In a semiconductor integrated circuit, the wiring is formed using a metal or polysilicon and therefore, as depicted in the cline 1 of FIG. 19, the wiring is represented by a resistance (wiring resistance) and capacitance (wiring capacitance).

FIG. 20 is an explanatory diagram of an example of a wiring table. A wiring table 2000 retains therein values of the wiring resistance and the wiring capacitance of the wiring from the output of each cell to the input of a downstream cell in the circuit information 1900. The wiring table 2000 includes a wiring column 2001, a wiring resistance column 2002, and a wiring capacitance column 2003.

The wiring column 2001 retains therein the wiring name. The wiring resistance column 2002 retains therein the value of the wiring resistance. The wiring capacitance column 2003 retains therein the value of the wiring capacitance. The wiring table 2000 is created by a design engineer, based on the wiring information extracted from the layout data of the circuit under design.

Referring back to FIG. 19, for example, the downstream cell of the cell C1 is the cell C2. The input capacitance of the cell C2 is a part of the load capacitance of the output of the cell C1 (load capacitance of the cell C1). The "input capacitance of a cell" is, for example, gate capacitance of a MOS in the cell.

FIG. 21 is an explanatory diagram of an example of the input capacitance of a cell. An input capacitance table 2100 retains therein the value of the input capacitance of each cell. The input capacitance table 2100 includes a cell name column 2101 and an input capacitance column 2102. For example, when the cell name retained in the cell name column 2101 is "INVERTER 1", the input capacitance column 2100 retains therein "five [fF]".

Referring back to FIG. 19, for example, the cell C7 has no downstream cell and downstream therefrom is an output terminal. In this case, the load resistance and the load capacitance of the output of the cell C7 are unknown and therefore, in the second embodiment, the values of an external load resistance and external load capacitance that are defined in advance by the user (the design engineer, or a verifying engineer) are used as the values of the load resistance and the load capacitance of the cell C7.

The cell C1 has no upstream cell and upstream therefrom is the input terminal. In this case, the input through is unknown and therefore, in the second embodiment, an external input through defined in advance by the user (the design engineer, or the verifying engineer) is used as the input through of the cell C1.

FIG. 22 is an explanatory diagram of an example of a constraint table. A constraint table 2200 has stored therein an external input through and the values of the external load capacitance and the external load resistance. In the second embodiment, as described above, the value retained in an external input through column 2201 in the constraint table 2200 is used for the input through of the cell C1; and the values retained in an external load capacitance column 2202 and in an external load resistance column 2203 in the constraint table 2200 are used for the load capacitance and the load resistance of the cell C7.

FIG. 23 is an explanatory diagram of an example of a threshold table. A threshold table 2300 retains therein the threshold of the input voltage (hereinafter, "input threshold") and the threshold of the output voltage (hereinafter, "output threshold") used when the delay time period is calculated based on the temporal variation of the input voltage and that of the output voltage. The threshold table 2300 includes a cell name column 2301, an input threshold column 2302, and an output threshold column 2303.

The cell name column 2301 retains therein a cell name. The input threshold column 2302 retains therein the input threshold. The output threshold column 2303 retains therein the output threshold. Taking an example of a case where the cell name column 2301 retains "DEFAULT", the input threshold is 50[%] and the output threshold is 50[%]. In this case, it is indicated that the time difference between the elapsed time period for Vin that is Vdd×50[%] and the elapsed time period for Vds that is Vds×50[%] is the delay time period of the cell under design.

An example of a specific process will be described. In a first example, calculation of the delay time period and the input through will be described. In a second example, a case will be described where the threshold of the downstream cell of the cell under design is different from the threshold of the cell under design.

In the first example, the CPU 201 selects from the circuit information 1900, the cell C1 as the cell under design; acquires the value of the input capacitance of the cell downstream from the cell C1 (cell C2), the value of the wiring capacitance of the cline 1 of the output of the cell C1, and the value of the wiring resistance of the cline 1; and determines whether a cell upstream from the cell C1 is present. Because a cell upstream is not present, the CPU 201 acquires the value retained in the external input through column 2201 in the constraint table 2200 and determines this value as the input through of the cell C1.

The acquisition results are as follows.

Value of Input Capacitance of Cell Downstream from Cell C1 (Cell C2): 5 [fF]
Value of Wiring Capacitance of "cline 1": 5 [fF]
Value of Wiring Resistance of "cline 1": 50[Ω]
External Input Through: 10E-12 [sec]

The CPU 201 automatically selects the cell under design in the second embodiment and therefore, the CPU 201 accesses the storage device and acquires the values of the wiring capacitance and the wiring resistance, and the external input through. Not limited hereto, for example, the user may select a cell under design and input into the design support apparatus 1600, the values of the wiring capacitance and the wiring resistance, and the external input through, whereby the CPU 201 receives the input.

For example, because the cell name of the cell C1 is "INVERTER 1", the CPU 201 extracts using the extracting unit 1601, the electric-current table of the rising edge input or the falling edge input, from the electric-current table of the INVERTER 1 based on the external input through. Taking an example of the rising edge input in this case, the electric-current table 1300 is acquired.

For example, the CPU 201 calculates the value of the load capacitance of the cell C1, based on the values of the input capacitance of the cell C2 and the wiring capacitance of the cline 1.

The value of the load capacitance of the cell C1=the value of the input capacitance of the cell C2+the value of the wiring capacitance of the cline 1

=5.0E-15 [F]+5.0E-15 [F]

=10.0E-15 [F]

For example, the CPU 201 calculates the time constant by multiplying the value of the load capacitance of the cell C1 by the value of the wiring resistance of the cline 1. The calculation result is as follows.

Time constant of the cell C1=the value of the load capacitance of the cell C1×the value of the wiring resistance of the cline 1

=10.0E-15 [F]×50[Ω]

=0.5E-12 [sec]

Figure 24:
FIG. 24 is an explanatory diagram of exemplary calculation of output voltage.

FIG. 24 is an explanatory diagram of exemplary calculation of the output voltage. For example, the CPU 201 calculates the value of the output voltage for each elapsed time period, based on the electric-current table extracted and the internal resistance of the NMOS of the INVERTER 1. A table 2400 is the calculation result. The table 2400 includes an elapsed time period column 2401, a Vds_nonRC column 2402, and a Vin column 2403. The table 2400 is stored to a storage device such as the RAM 203, the magnetic disk 205, or the optical disk 207.

The elapsed time period of Vds_nonRC for which the operational region of the INVERTER 1 is the saturation region is not corrected using the time constant, and the elapsed time period of Vds_nonRC for which the operational region of the INVERTER 1 is the non-saturation region is corrected using the time constant. In the second embodiment, when the operational region is the saturation region, the output current sufficiently flows and therefore, the effects of the load capacitance and the load resistance of the cell C1 are small. Therefore, the elapsed time period of Vds_nonRC for which the operational region is the saturation region is not corrected.

For example, the CPU 201 calculates Vgs(Vin)−Vth for each Vds_nonRC, using the determining unit 1602; and determines whether the Vds_nonRC is Vds_nonRC<Vgs(Vin)−Vth, for each Vds_nonRC, using the determining unit 1602. For example, the CPU 201 determines, using the determining unit 1602, the elapsed time period of the Vds_nonRC as the elapsed time period to be corrected when the Vds_nonRC is Vds_nonRC<Vgs(Vin)−Vth.

FIG. 25 is an explanatory diagram of exemplary determination of the elapsed time period to be corrected. For example, when the elapsed time period is 10E-12 [sec], the Vds_nonRC is about 1.51 [V] and Vgs−Vth is 1.44 [V]. Therefore, the Vds_nonRC is Vds_nonRC≧Vgs−Vth. Consequently, when the elapsed time period is 10E-12 [sec], the operational region of the NMOS of the INVERTER 1 is the saturation region.

For example, when the elapsed time period is 11E-12 [sec], the Vds_nonRC is about 1.41 m and the Vgs−Vth is 1.44 [V]. Therefore, the Vds_nonRC is Vds_nonRC≧Vgs−Vth. Consequently, when the elapsed time period is 11E-12 [sec], the operational region of the NMOS of the INVERTER 1 is the non-saturation region. Therefore, the elapsed time period that is 10E-12 is determined as the elapsed time period to be corrected. In this case, 11E-12 to 19E-12 [sec] are determined as the elapsed time periods to be corrected.

Figure 26:
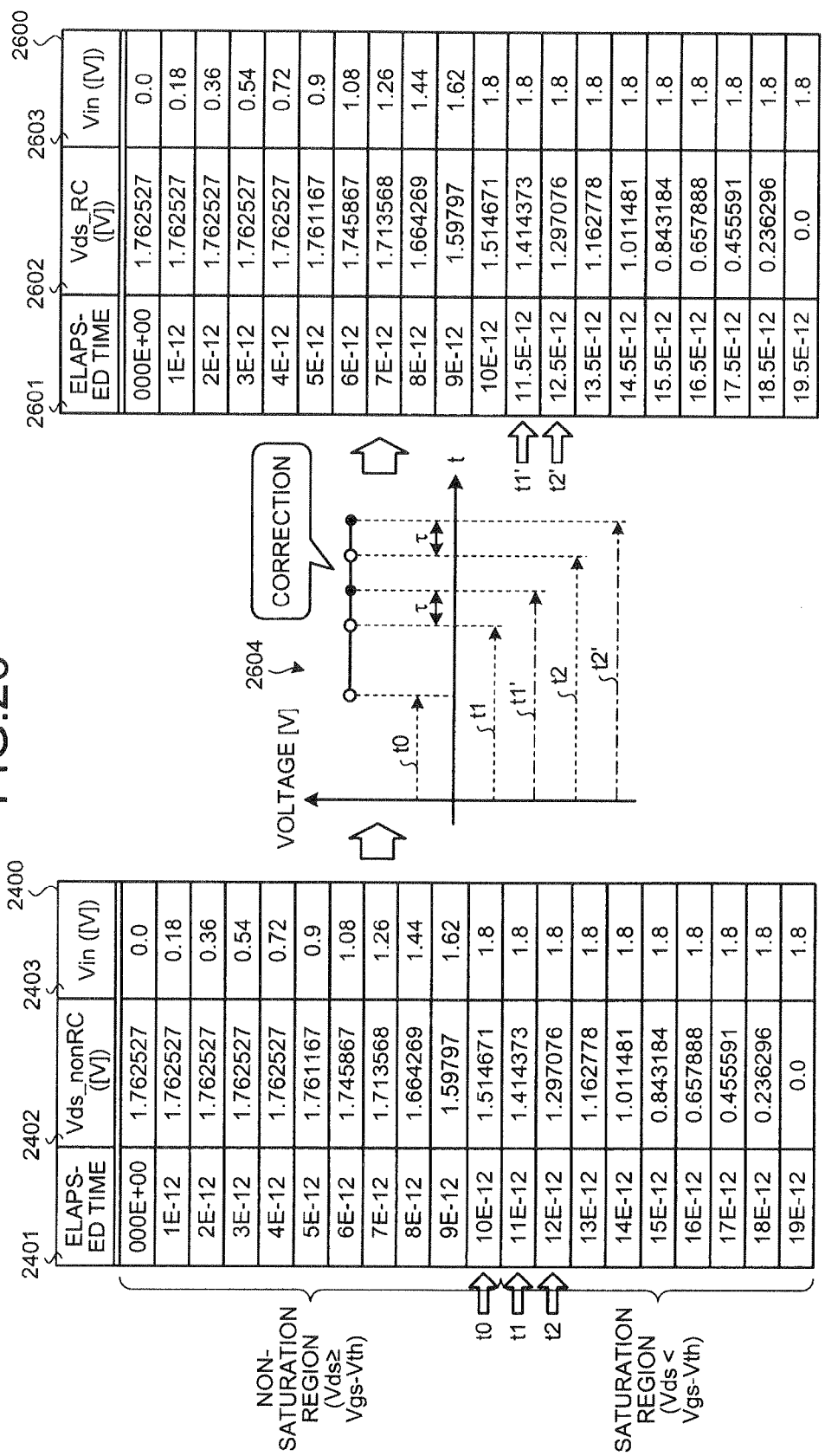
FIG. 26 is an explanatory diagram of exemplary correction.

FIG. 26 is an explanatory diagram of exemplary correction. For example, the CPU 201 corrects using the correcting unit 1603, the elapsed time period to be corrected by adding the time constant of the cell C1 calculated to each elapsed time period that is determined as the elapsed time period to be corrected.

In FIG. 26, for example, though "t0" is not the elapsed time period to be corrected, "t1" and "t2" are elapsed time periods to be corrected. In a graph 2604, t1 and t2 are corrected by adding τ thereto. The correction results for t1 and t2 are "t1'" and "t2'", respectively. For example, the CPU 201 outputs using the output unit 1604, the value of the output voltage for each elapsed time period after correction and the output voltage value for each elapsed time period that is not determined as the elapsed time period to be corrected.

The form of the output can be, for example, display on the display 208, output to the printer 213 for printing, or transmission to an external apparatus by the I/F 209. The output voltage values may be stored to a storage device such as the RAM 203, the magnetic disk 205, or the optical disk 207.

The output result can be a table 2600 that includes an elapsed time period column 2601, a Vds_RC column 2602, and a Vin column 2603. The elapsed time period column 2601 retains therein an elapsed time period. The Vds_RC column 2602 retains therein the Vds_RC. The Vin column retains therein the Vin. As to the Vds_RC, the voltage value thereof does not vary from the Vds_nonRC though the elapsed time period thereof is corrected.

If the number of measurements (the number of elapsed time periods) are few, the elapsed time periods for the output voltage values may be corrected. For example, the CPU 201 corrects the elapsed time periods using Equation (7) below by calculating the Vds_RC for an elapsed time period (tZ) that is intermediate between one elapsed time period (tX) and the next elapsed time period (tY) of the one elapsed time period.

$$Vds\_RC(tZ) = \{Vds\_RC(tX)\,[V] - Vds\_RC(tY)\,[V]\} / \{tX\,[psec] - tY\,[psec]\} \times \tau\,[psec] + Vds\_RC(tY)\,[V] \quad (7)$$

For example, the correction will be described taking an example of a case where the tA and the tB are as follows.

tX=13.5[psec]
tY=12.5 [psec]
tZ=13 [psec]
Vds (tX)=1.162[V]
Vds (tY)=1.297[V]
τ=0.5[psec]

$$Vds\_RC(13) = \{1.297\,[V] - 1.162\,[V]\} / \{13.5\,[psec] - 12.5\,[psec]\} \times 0.5\,[psec] + 1.162\,[V] = 1.229\,[V]$$

FIG. 27 is an explanatory diagram of the correction result. A table 2700 is the correction result acquired by correcting the table 2700 using Equation (7). The table 2700 includes an elapsed time period column 2701, a Vds_RC column 2702, and a Vin column. In FIG. 27, the Vin column is not depicted. The correction has been executed only for a section between 12.5 and 19.5 [psec] as an example.

Calculation of the delay time period of the cell under design will be described. For example, the CPU 201 retrieves the input threshold and the output threshold of the cell under design from the threshold table 2300, based on the cell name. The cell name corresponding to "INVERTER 1" is not present in the threshold table 2300 and therefore, the threshold of DEFAULT is retrieved. The input threshold of DEFAULT is 50[%] and the output threshold thereof is 50[%].

For example, the CPU 201 identifies using the identifying unit 1605, the elapsed time period for Vds_RC that is equal to the output threshold of the cell under design acquired from the table 2700, and the elapsed time period for Vin that is equal to the input threshold of the cell under design acquired from the table 2700. For example, the CPU 201 calculates using the calculating unit 1606, the time difference between the elapsed time period for the Vin identified and that for the Vds_RC identified as the delay time period.

Figure 28:
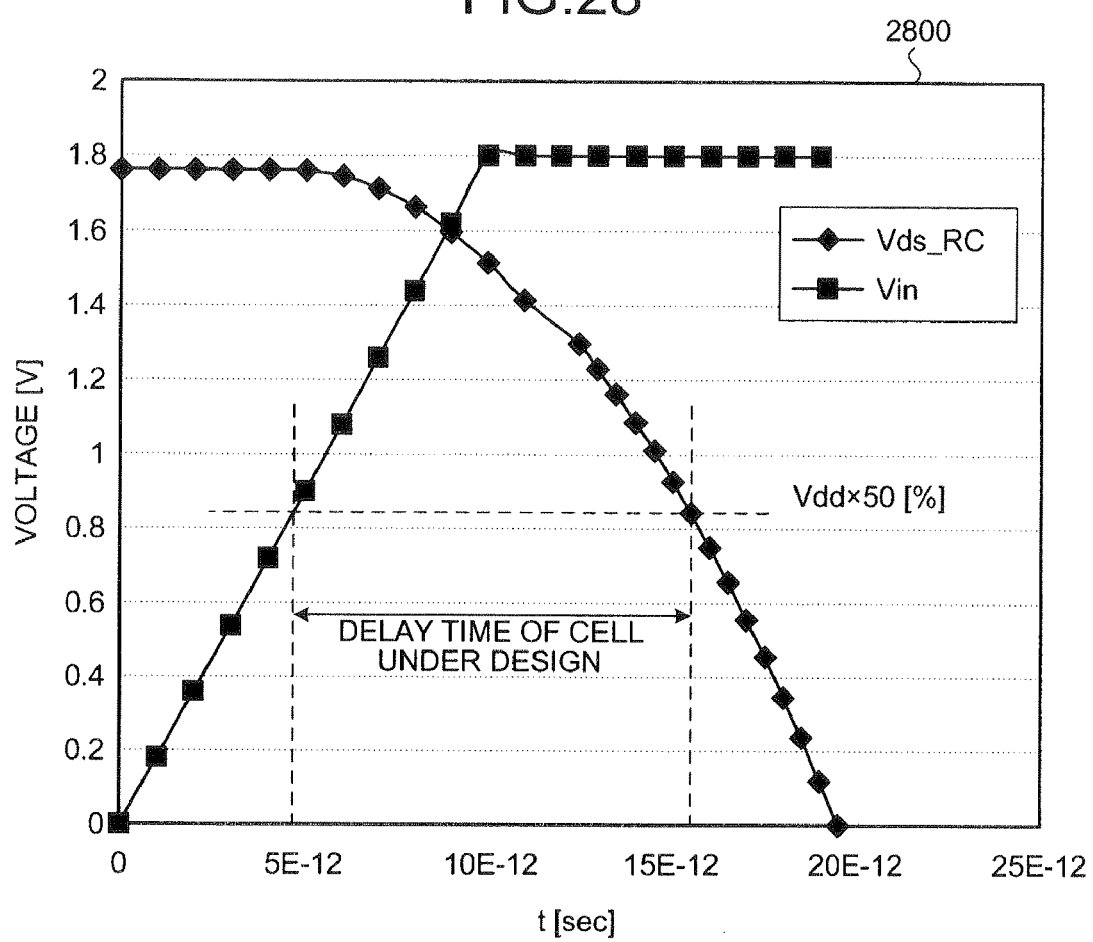
FIG. 28 is an explanatory diagram of exemplary calculation of a delay time period.

FIG. 28 is an explanatory diagram of exemplary calculation of the delay time period. In a graph 2800, input voltage values for the elapsed time periods are plotted and a line is depicted that sequentially connects the plotted values in order of elapsed time period (input voltage line), and output voltage values for the elapsed time periods are plotted and a line is depicted that sequentially connects the plotted values in order of elapsed time period (output voltage line). In the graph 2800, the axis of abscissa represents the elapsed time period and the axis of ordinate represents the voltage.

The input threshold is 50[%] and the output threshold is 50[%]. The time difference between the elapsed time period corresponding to a voltage that is Vdd×50[%] on the input voltage line and the elapsed time period corresponding to a voltage that is Vdd×50[%] on the output voltage line is the delay time period of the cell under design. The input and the output voltage lines each simply connect the plotted values sequentially in order of elapsed time period. However, not limited hereto, for example, approximation such as linear approximation may be executed.

Calculation of the output-through of the cell under design will be described. The output-through of the cell under design is used as an input through of the cell downstream from the cell under design. For example, the output-through of the falling edge output of the cell under design is used for calculation of the delay time period of the falling edge input of the downstream cell, and the output-through of the rising edge output of the cell under design is used for calculation of the delay time period of the rising edge input of the downstream cell.

In the second embodiment, for the falling edge output, the output-through is defined as the time difference between the elapsed time period corresponding to a voltage that is Vdd×80[%] and the elapsed time period corresponding to a voltage that is Vdd×20[%] and, for the rising edge output, the output-through is defined as the time difference between the elapsed time period corresponding to a voltage that is Vdd×20[%] and the elapsed time period corresponding to a voltage that is Vdd×80[%].

For example, the CPU 201 identifies using the identifying unit 1605, the elapsed time periods for Vds_RC corresponding to the voltages that are Vdd×80[%] and Vdd×20[%] from the table 2700, and calculates using the calculating unit 1606, the time difference between the two elapsed time periods identified, as the output-through.

Figure 29:
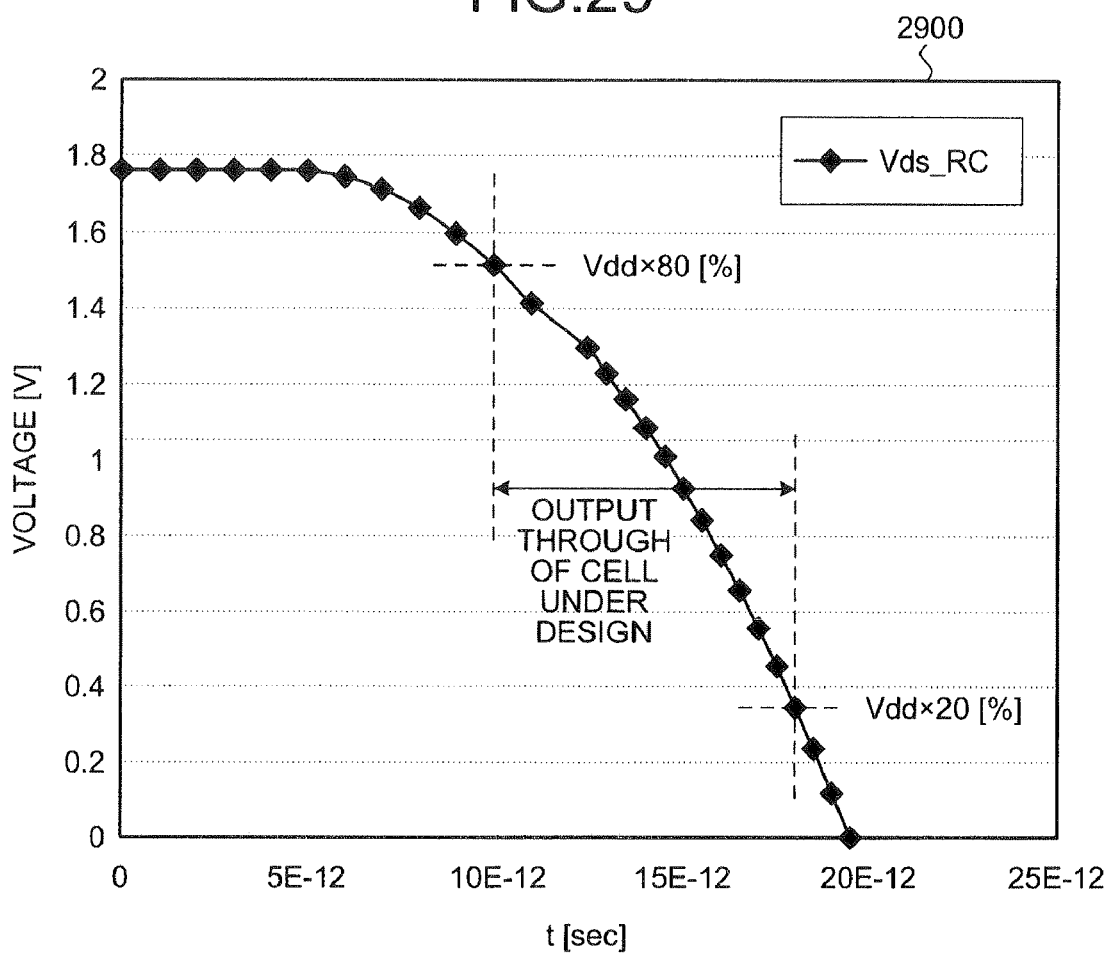

FIG. 29 is an explanatory diagram of exemplary calculation of the output-through. In a graph 2900, output voltage values for the elapsed time periods are plotted and a line is depicted that sequentially connects the plotted values in order of elapsed time period. In the graph 2900, the axis of abscissa represents the elapsed time period and the axis of ordinate represents the voltage.

The time difference between the elapsed time period for the voltage that is Vdd×80[%] and the elapsed time period for the voltage that is Vdd×20[%] is the output-through. For example, the CPU 201 outputs the delay time period and the output-through calculated. The form of the output can be, for example, display on the display 208, output to the printer 213 for printing, or transmission to an external apparatus by the I/F 209. Another form of output may be an output for storage to a storage device such as the RAM 203, the magnetic disk 205, or the optical disk 207.

A case will be described where the output threshold of the cell under design and the input threshold of the cell downstream from the cell under design differ from each other. In a second example, the cell under design is the cell C4 in the circuit information 1900.

For example, the CPU 201 identifies the downstream cell of the cell C4, from the circuit information 1900. In this case, the cell C5 is identified as the downstream cell. For example, the CPU 201 retrieves from the threshold table 2300 and based on the cell name, the input threshold of the cell under design, and retrieves from the threshold table 2300 and based on the cell name, the input threshold of the downstream cell.

The cell name of the cell C4 is "BUFFER 1" and therefore, the input threshold of the cell C4 is 40[%]. The cell name of the cell C5 is "BUFFER 2" and therefore, the input threshold of the cell C5 is 50[%].

For example, the CPU 201 identifies using the identifying unit 1605, the elapsed time period for the Vds_RC having a value equal to the input threshold of the cell under design and the elapsed time period for the Vin having a value equal to the input threshold of the downstream cell, and calculates using the calculating unit 1606, the time difference between the two elapsed time periods identified, as the delay time period.

Figure 30:
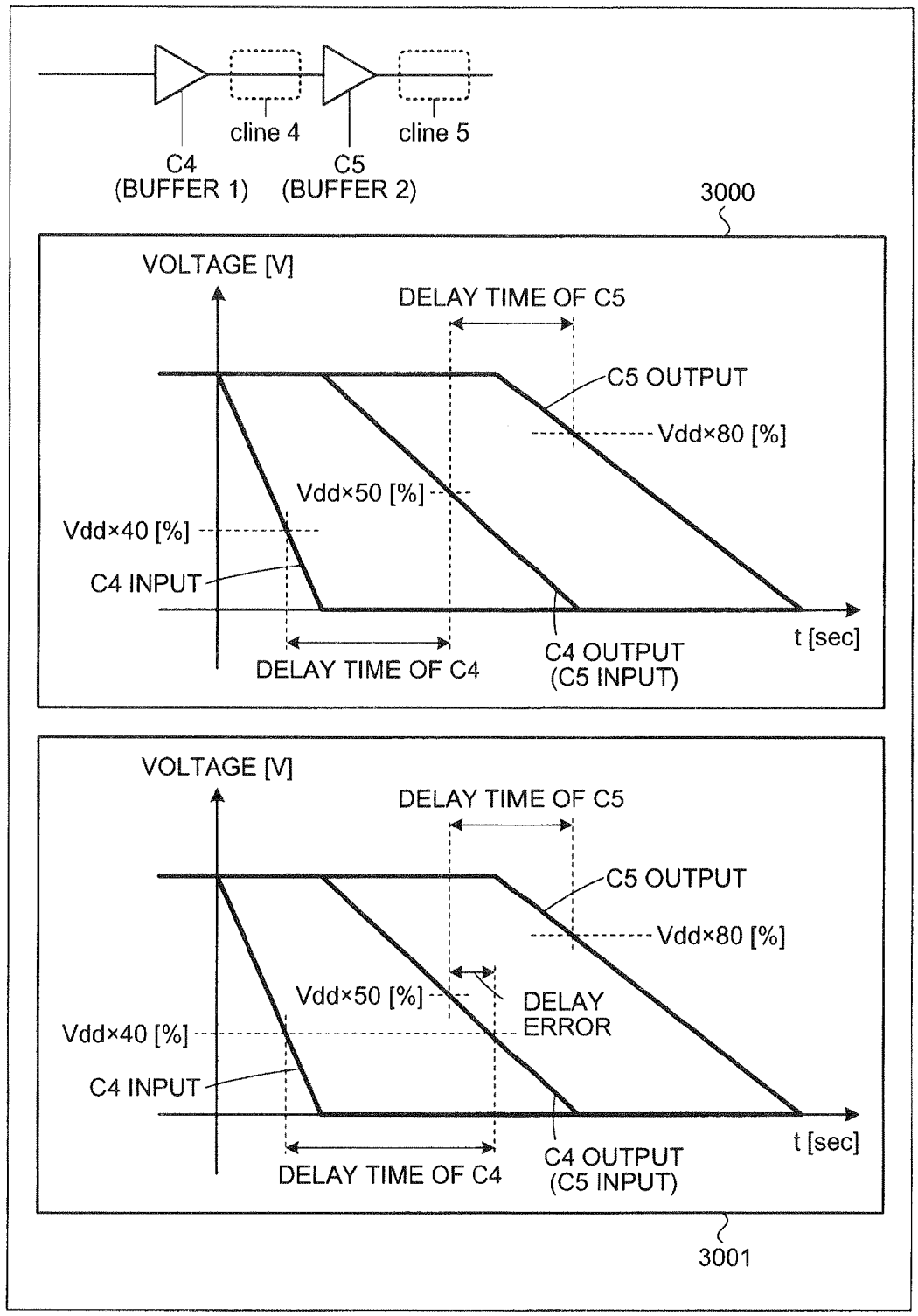
FIG. 30 is an explanatory diagram of calculation of a delay time period in a second example.
Figure 31:
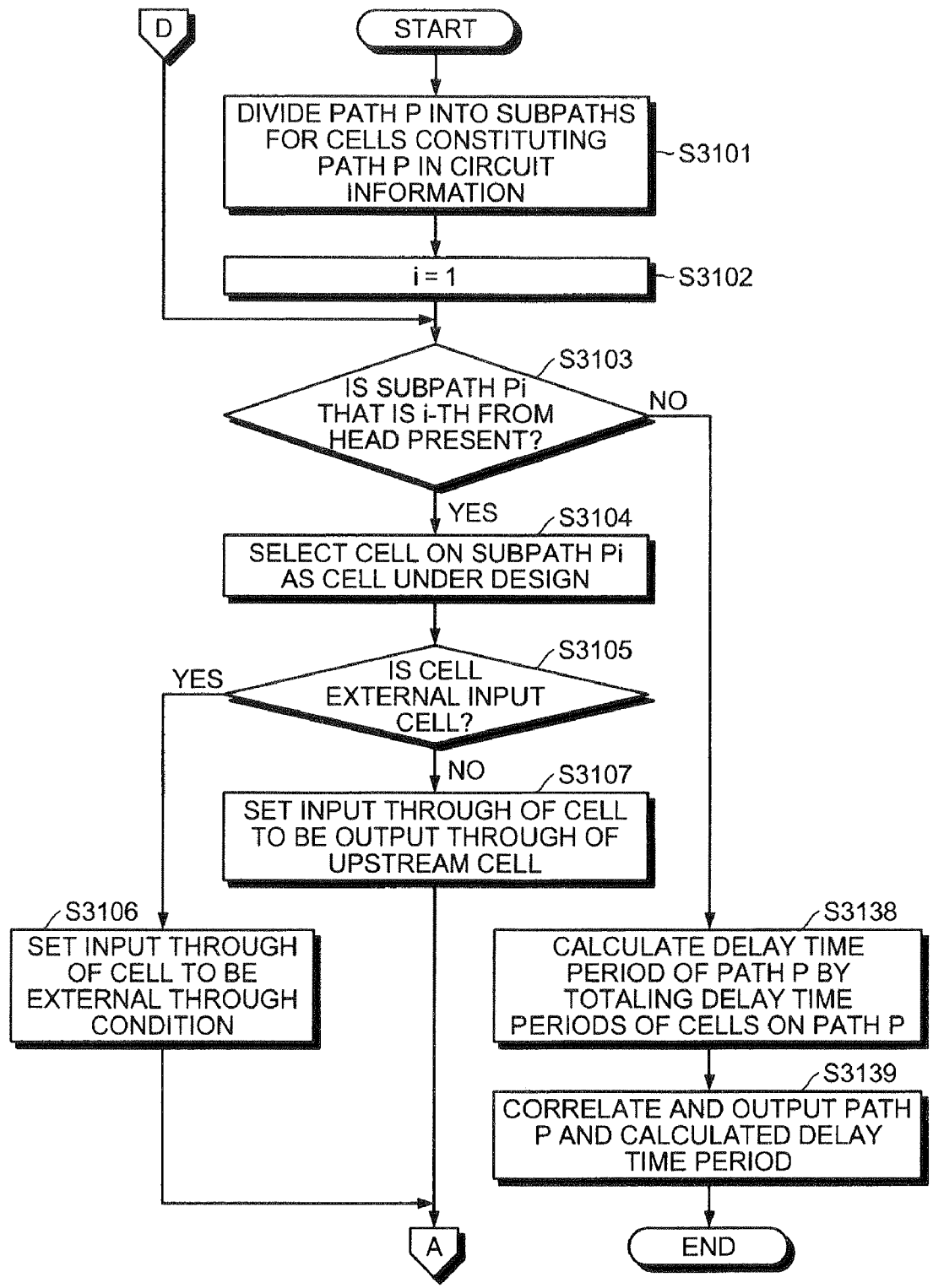
Figure 32:
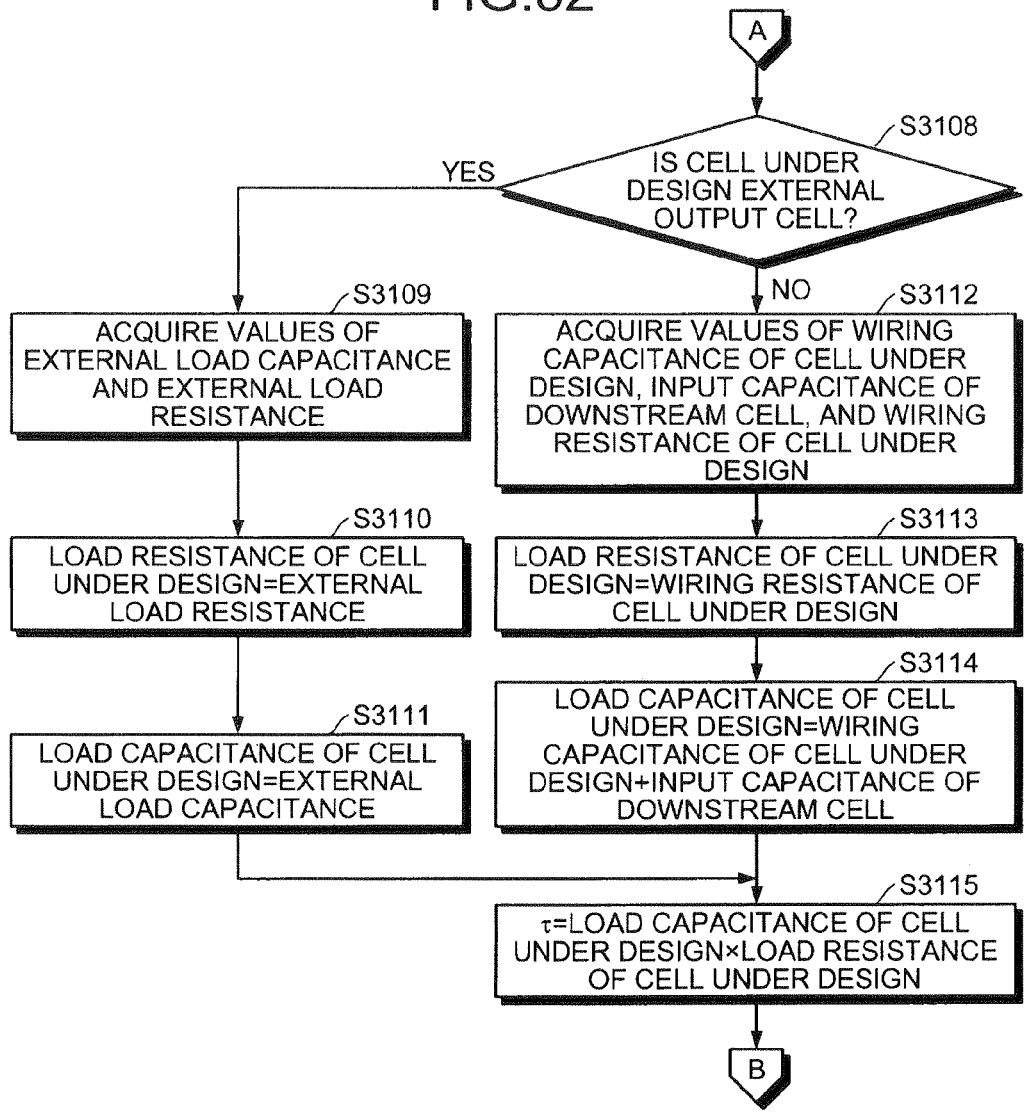
Figure 33:
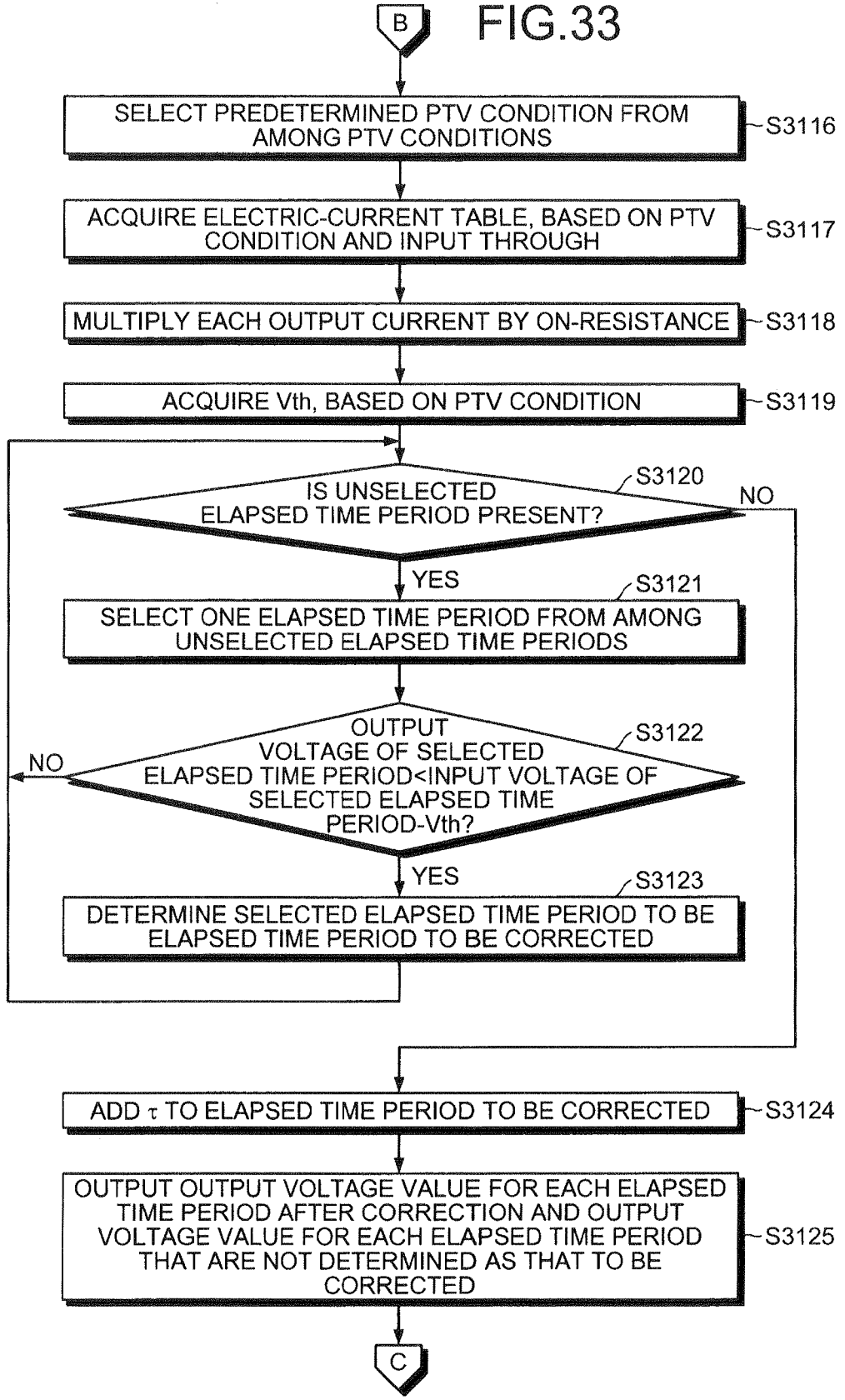

FIG. 30 is an explanatory diagram of calculation of the delay time period in the second example. In a graph 3000, exemplary calculation of the delay time period in the second example is depicted. In the graphs 3000 and 3001, the input of the cell C4, the output of the cell C4 (the input of the cell C5), and the output of the cell C5 are depicted.

For the graph 3001, the output threshold of the BUFFER 1 in the table is used for calculating the delay time period of the cell C4. In the graph 3001, a time period is present that is shared by the calculation of the delay time periods of the cells C4 and C5 and this time period is a delay error.

On the other hand, in the graph 3000, the input threshold of the cell C5 is used as the output threshold of the cell C4 for calculating the delay time period of the cell C4 and therefore, the delay error does not occur. The occurrence of the delay error can be prevented.

FIGS. 31 to 34 are flowcharts of an example of a process procedure for a design support process by the design support apparatus 1600 according to the second embodiment. The CPU 201 divides the path P into sub-paths respectively for each the cell that constitutes the path P in the circuit information (step S3101), sets "i" to be i=1 (step S3102), and determines whether a sub-path Pi that is i-th from the head of the path P is present (step S3103).

If the CPU 201 determines that the sub-path Pi that is i-th from the head is present (step S3103: YES), the CPU 201 selects the cell on the sub-path Pi as the cell under design (step S3104). The CPU 201 determines whether the cell under design is an external input cell, based on whether a cell upstream from the cell under design is present (step S3105).

If the CPU 201 determines that the cell under design is an external input cell (step S3105: YES), the CPU 201 sets the input through of the cell under design to be an external through condition (step S3106). On the other hand, if the CPU 201 determines that the cell under design is not an external input cell (step S3105: NO), the CPU 201 sets the input through of the cell under design to be the output-through of the upstream cell (step S3107).

After step S3106 or S3107, the CPU 201 determines whether the cell under design is an external output cell, based on whether a cell downstream from the cell under design is present (step S3108). The "external output cell" refers to a cell under design whose output is not connected to any other cell, whose output is connected to an output terminal, or whose output is to an external destination.

At step S3108, if the CPU 201 determines that the cell under design is an external output cell (step S3108: YES), the CPU 201 acquires the values of the external load capacitance and the load resistance for the cell under design (step S3109). The CPU 201 sets the value of the load resistance of the cell under design to be the value of the external load resistance (step S3110) and sets the value of the load capacitance of the cell under design to be the value of the external load capacitance (step S3111).

At step S3108, if the CPU 201 determines that the cell under design is not an external output cell (step S3108: NO), the CPU 201 acquires the values of the wiring capacitance of the cell under design, the input capacitance of the downstream cell, and the wiring resistance of the cell under design (step S3112). The CPU 201 sets the value of the wiring resistance of the cell under design to be the value of the wiring resistance of the cell under design (step S3113) and sets the value of the load capacitance of the cell under design to be the value of the wiring capacitance of the cell under design+the value of the input capacitance of the downstream cell (step S3114).

After step S3111 or S3114, the CPU 201 sets "τ" to be the value of the load capacitance of the cell under design×the value of the load resistance of the cell under design (step S3115), selects a certain PTV condition from among the PTV conditions (step S3116), and acquires the electric-current table and the ON-resistance value of the cell under design (step S3117).

The CPU 201 multiplies each output current value in the electric-current table acquired by the ON-resistance value acquired (step S3118), acquires the Vth of the cell under design, based on the PTV condition (step S3119), and determines whether any unselected elapsed time period is present (step S3120). If the CPU 201 determines that an unselected elapsed time periods is present (step S3120: YES), the CPU 201 selects one elapsed time period from among the unselected elapsed time periods (step S3121).

The CPU 201 determines whether the output voltage value of the elapsed time period selected is less than the input voltage value of the elapsed time period selected-Vth (step S3122). If the CPU 201 determines that the output voltage value of the elapsed time period selected is less than the input voltage value of the elapsed time period selected-Vth (step S3122: YES), the CPU 201 determines the elapsed time period selected as the elapsed time period to be corrected (step S3123) and the procedure returns to step S3120. If the CPU 201 determines that the output voltage value of the elapsed time period selected is not less than the input voltage value of the elapsed time period selected-Vth (step S3122: NO), the procedure returns to step S3120.

If the CPU 201 determines at step S3120 that no unselected elapsed time period is present (step S3120: NO), the CPU 201 corrects the elapsed time period that is determined to be corrected by adding τ thereto (step S3124) and outputs the output voltage value for each elapsed time period after correction and the output voltage value for each elapsed time period that is not determined to be corrected (step S3125).

The CPU 201 determines whether a cell downstream from the cell under design is present (step S3126). If the CPU 201 determines that a downstream cell is present (step S3126: YES), the CPU 201 acquires the input thresholds of the cell under design and the downstream cell (step S3127) and identifies the elapsed time period for the output voltage value that is the input threshold of the downstream cell (step S3128).

On the other hand, if the CPU 201 determines at step S3126 that a downstream cell is not present (step S3126: NO), the CPU 201 acquires the input threshold and the output threshold of the cell under design (step S3129) and identifies the elapsed time period for the output voltage value that is the output threshold of the cell under design (step S3130).

After step S3128 or S3130, the CPU 201 identifies the elapsed time period for the input voltage value that is the input threshold of the cell under design (step S3131), calculates the time difference between the two elapsed time periods identified (step S3132), and outputs the cell under design and the time difference calculated correlating the cell under design with the time difference as the delay time period thereof (step S3133).

In the flowchart, the delay time period of the path P is calculated and therefore, when a cell downstream from the cell under design is present, the delay time period is calculated using the input threshold of the downstream cell as the output threshold of the cell under design. Thereby, the delay error of the path P can be suppressed. If only the delay time period of the cell under design is necessary, the output threshold of the cell under design may be acquired and the delay time period may be calculated using the acquired value even if a cell downstream from the cell under design is present.

The CPU 201 identifies the elapsed time period for the output voltage value that is the threshold of the output-through (step S3134), calculates the output-through of the cell under design (step S3135), outputs the cell under design and the output-through correlating these to each other (step S3136), and sets "i" to be i=i+1 (step S3137). The procedure returns to step S3103.

If the CPU 201 determines at step S3103 that the sub-path Pi that is i-th from the head is not present (step S3103: NO), the CPU 201 calculates the delay time period of the path P by totaling the delay time periods of the cells on the path P (step S3138) and outputs the path P and the delay time period calculated correlating these with each other (step S3139).

As described above, according to the embodiments, the time constant of R (load resistance) C (load capacitance) of the output of the cell under design is defined as the delay time period by which the variation of the output voltage is delayed due to charging and discharging of the RC. The delayed time period is added to the elapsed time period that has elapsed from the start of the variation of the input voltage applied to the cell under design and thereby, the elapsed time period is corrected. Thereby, the transient response by the RC that differs depending on the cells in the circuit under design is restored. The output voltage that is made sluggish by the RC can be restored and the delay error can be suppressed.

The delay time period of the cell under design is calculated based on the output voltage value and the input voltage value for each elapsed time period after the correction and thereby, a delay time period having a small delay error can be automatically calculated.

If a cell downstream from the cell under design is present, the delay time period is calculated using the threshold of the input voltage of the downstream cell as the threshold of the output voltage of the cell under design and thereby, a delay time period having a small delay error can be automatically calculated. Therefore, an accurate delay time period of the path can be calculated.

As described above, according to the embodiments, the variation time period is calculated during which the output current value varies from that for the lowest voltage value among the output voltage values that are equal to higher than the specific threshold to that for the highest voltage value thereof. The elapsed time period from the start of the variation of the input voltage applied to the cell is calculated based on the variation time period for each output current value, and the elapsed time period for each output current value is stored to the storage device. Thereby, a table including the output current values for elapsed time periods can easily be created. The table of the output current value can also be used for calculation of the delay time periods and an analysis of the electric power.

As described above, according to the embodiments, the variation time period is calculated during which the output current value varies from that for the lowest voltage value among the output voltage values that are less than the specific threshold to that for the highest voltage value thereof. The elapsed time period from the start of the variation of the input voltage applied to the cell is calculated based on the variation time period for each output current value, and the elapsed time period for each output current value is stored to the storage device. Thereby, a table including the output current values for elapsed time periods can easily be created. The table of the output current value can also be used for calculation of the delay time periods and an analysis of the electric power.

The design support method described in the first and the second embodiments may be implemented by executing a prepared program on a computer such as a personal computer and a workstation. The program is stored on a computer-readable, non-transitory medium such as a hard disk, a flexible disk, a CD-ROM, an MO, and a DVD, read out from the recording medium, and executed by the computer. The program may be a transmission medium that can be distributed through a network such as the Internet.

According to the embodiments, an effect is achieved that the sluggish output voltage at the RC can be restored and the delay error can be suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable medium storing therein a design support program that causes a computer capable of accessing a storage device storing therein, for each of a plurality of cells, output voltage values for a plurality of elapsed time periods from a start time of variation of an input voltage applied to the cell, to execute a process comprising:
    extracting, from the storage device, the output voltage values corresponding to a cell to be designed, the cell to be designed being selected from circuit information of a circuit to be designed;
    determining, from among the elapsed time periods corresponding to the extracted output voltage values, an elapsed time period to be corrected on the basis of a specific voltage value;
    correcting the elapsed time period that is determined by adding a time constant to an output side of the cell to be designed to the determined elapsed time period, the time constant being determined on the basis of wiring resistance and load capacitance of the output side of the cell to be designed; and
    outputting, from among the extracted output voltage values, the output voltage value for the elapsed time period that is corrected and the second output voltage value for the elapsed time period that has not been corrected.

2. The non-transitory computer-readable medium of claim 1, the process further comprising:
    identifying the elapsed time period corresponding to the output voltage value that is a threshold of an output voltage of the cell to be designed from among the output voltage values that is outputted; and
    calculating a time difference between the elapsed time period from the start time of variation of the input voltage applied to the cell to be designed until the input voltage reaches a threshold of the input voltage and the elapsed time period that is identified.

3. The non-transitory computer-readable medium of claim 1, the process further comprising:
    identifying the elapsed time period corresponding to the output voltage value that is a threshold of an input voltage of a cell coupled to an output of the cell to be designed from among the output voltage values that is outputted; and
    calculating a time difference between the elapsed time period from the start time of variation of the input voltage applied to the cell to be designed until the input voltage reaches a threshold of the input voltage, and the elapsed time period that is identified.

4. A design support apparatus comprising:
    an extracting unit configured to extract, from a storage device storing therein, for each of a plurality of cells, output voltage values for a plurality of elapsed time periods from a start time of variation of an input voltage applied to the cell, the output voltage values corresponding to a cell to be designed, the cell to be designed being selected from circuit information of a circuit to be designed,
    a determining unit configured to determine, from among the elapsed time periods corresponding to the extracted output voltage values, an elapsed time period to be corrected, on the basis of a specific voltage value;
    a correcting unit configured to correct the elapsed time period that is determined by adding a time constant to an output side of the cell to be designed to the determined elapsed time period, the time constant being determined on the basis of wiring resistance and load capacitance of the output side of the cell to be designed; and
    an output unit configured to output, from among the extracted output voltage values, the output voltage value for the elapsed time period that is corrected by the correcting unit and the second output voltage value for the elapsed time period that has not been corrected by the correcting unit.

5. A design support method executed by a computer capable of accessing a storage device storing therein for each of a plurality of cells, output voltage values for a plurality of elapsed time periods from a start time of variation of an input voltage applied to the cell, the design support method comprising:
    extracting, from the storage device, the output voltage values corresponding to a cell to be designed, the cell to be designed being selected from circuit information of a circuit to be designed;
    determining, from among the elapsed time periods corresponding to the extracted output voltage values, an elapsed time period to be corrected, on the basis of a specific voltage value;
    correcting the elapsed time period that is determined by adding a time constant to an output side of the cell to be designed to the determined elapsed time period, the time constant being determined on the basis of wiring resistance and load capacitance of the output side of the cell to be designed; and
    outputting, from among the extracted output voltage values, the output voltage value for the elapsed time period that is corrected and the second output voltage value for the elapsed time period that has not been corrected.

* * * * *